(12) United States Patent
Hara et al.

(10) Patent No.: US 12,057,454 B2
(45) Date of Patent: Aug. 6, 2024

(54) ACTIVE MATRIX SUBSTRATE AND DISPLAY DEVICE

(71) Applicant: Sharp Kabushiki Kaisha, Sakai (JP)

(72) Inventors: Kengo Hara, Sakai (JP); Tohru Daitoh, Sakai (JP); Tetsuo Kikuchi, Sakai (JP); Masahiko Suzuki, Sakai (JP); Setsuji Nishimiya, Sakai (JP); Hitoshi Takahata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/119,629

(22) Filed: Mar. 9, 2023

(65) Prior Publication Data

US 2023/0215877 A1    Jul. 6, 2023

Related U.S. Application Data

(63) Continuation of application No. 17/224,166, filed on Apr. 7, 2021, now Pat. No. 11,631,704.

(60) Provisional application No. 63/012,991, filed on Apr. 21, 2020.

(51) Int. Cl.
 *H01L 27/12* (2006.01)
 *H01L 29/786* (2006.01)

(52) U.S. Cl.
 CPC ........ *H01L 27/124* (2013.01); *H01L 27/1225* (2013.01); *H01L 29/78633* (2013.01); *H01L 29/7869* (2013.01)

(58) Field of Classification Search
 CPC ... H01L 27/124; H01L 27/12; H01L 27/1225; H01L 29/78633; H01L 29/786; H01L 29/7869; G02F 1/136277; G02F 1/1362; G02F 1/1368
 See application file for complete search history.

(56) References Cited

U.S. PATENT DOCUMENTS 9,190,524 B2 * 11/2015 Miyamoto .......... H01L 27/1225
2013/0188110 A1 * 7/2013 Miyamoto .......... H01L 27/1251
  438/157

OTHER PUBLICATIONS

Hara et al., "Active Matrix Substrate and Display Device", U.S. Appl. No. 17/224,166, filed Apr. 7, 2021.

* cited by examiner

*Primary Examiner* — Nikolay K Yushin
(74) *Attorney, Agent, or Firm* — Keating & Bennett, LLP

(57) ABSTRACT

An active matrix substrate includes a plurality of source bus lines and a plurality of gate bus lines and a plurality of oxide semiconductor TFTs that have a plurality of pixel TFTs, each of which is associated with one of the plurality of pixel regions, and a plurality of circuit TFTs constituting a peripheral circuit, in which each of oxide semiconductor TFTs has an oxide semiconductor layer and a gate electrode disposed on a channel region of the oxide semiconductor layer via a gate insulating layer, the plurality of oxide semiconductor TFTs have a plurality of first TFTs, a plurality of second TFTs, and/or a plurality of third TFTs, and the plurality of first TFTs have the plurality of pixel TFTs, and the plurality of second TFTs and/or the plurality of third TFTs have at least a portion of the plurality of circuit TFTs.

11 Claims, 14 Drawing Sheets

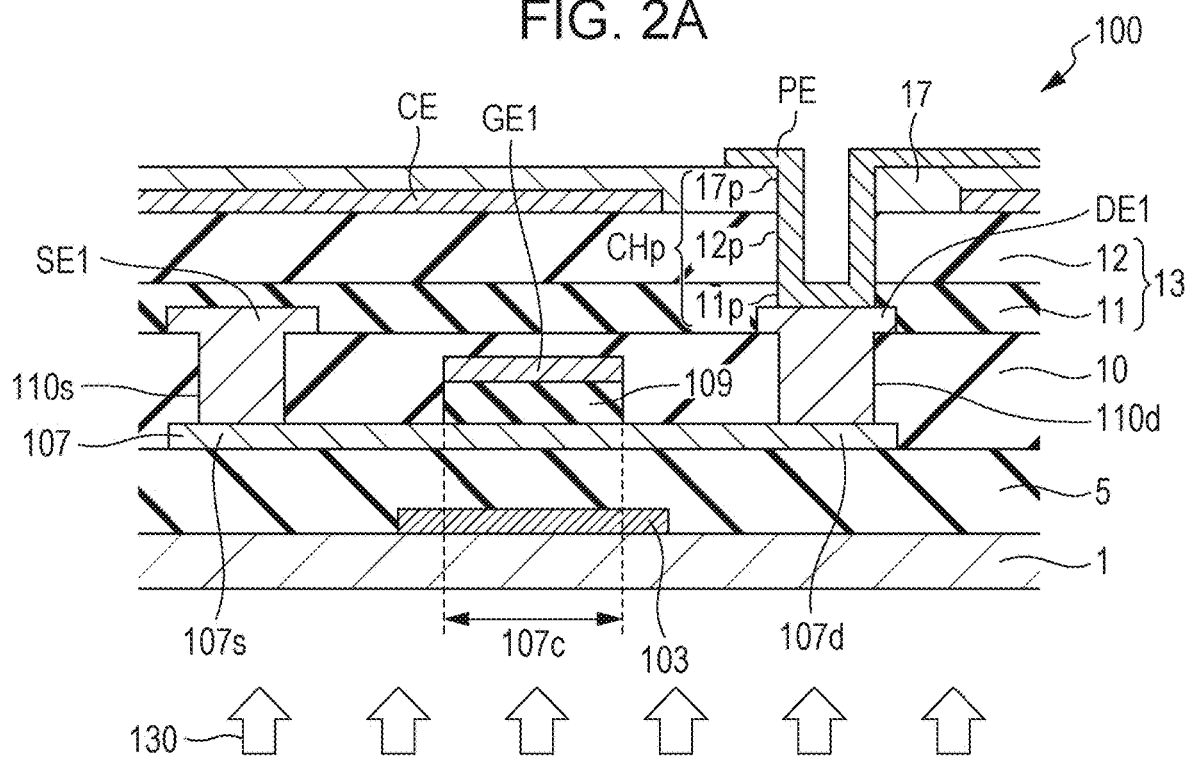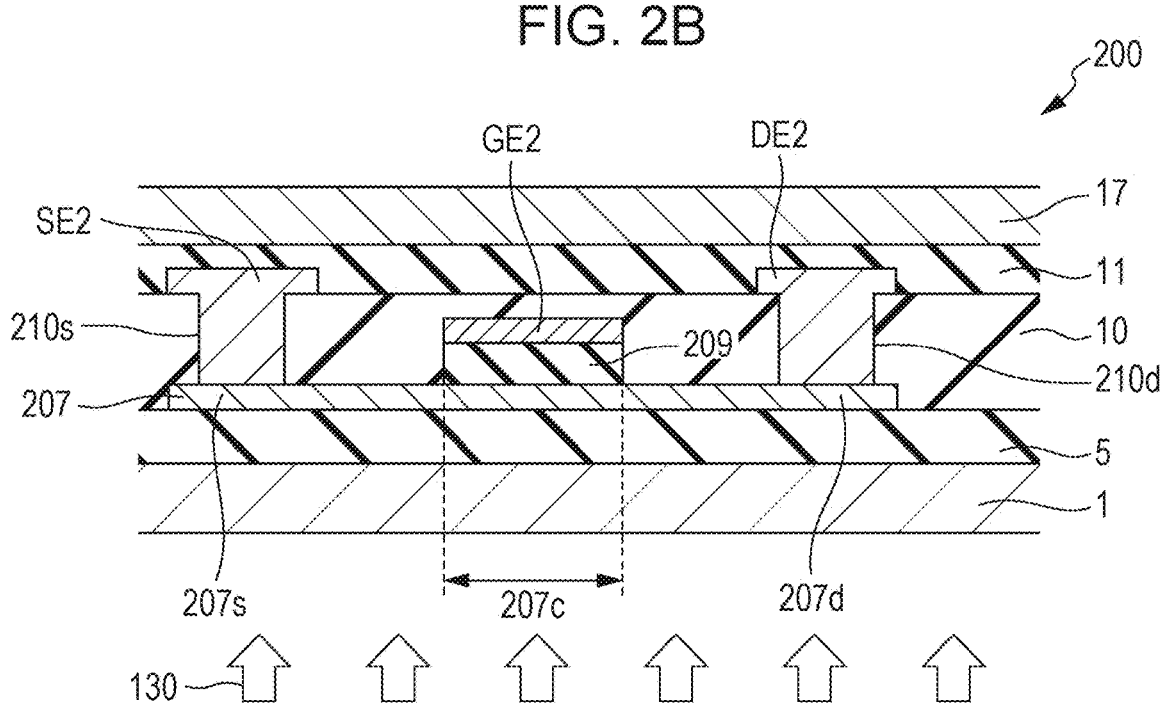

FIG. 13

| STEP 1<br>LOWER METAL LAYER | LOWER CONDUCTIVE FILM ACCUMULATION |
| --- | --- |
| | PHOTOLITHOGRAPHY STEP |
| | LOWER CONDUCTIVE FILM ETCHING |
| STEP 2<br>LOWER INSULATING LAYER | LOWER INSULATING LAYER FORMATION |
| STEP 3<br>OXIDE SEMICONDUCTOR LAYER | OXIDE SEMICONDUCTOR LAYER ACCUMULATION |
| | PHOTOLITHOGRAPHY STEP |
| | OXIDE SEMICONDUCTOR FILM ETCHING |
| STEP 4<br>GATE INSULATING LAYER<br>GATE METAL LAYER | GATE INSULATING FILM AND GATE CONDUCTIVE FILM ACCUMULATION |
| | PHOTOLITHOGRAPHY STEP |
| | GATE CONDUCTIVE FILM AND GATE INSULATING FILM ETCHING |
| STEP 5<br>INTERLAYER INSULATING LAYER | INTERLAYER INSULATING LAYER ACCUMULATION |
| | PHOTOLITHOGRAPHY STEP |
| | INTERLAYER INSULATING LAYER ETCHING |
| STEP 6<br>SOURCE METAL LAYER | SOURCE CONDUCTIVE FILM ACCUMULATION |
| | PHOTOLITHOGRAPHY STEP |
| | SOURCE CONDUCTIVE FILM ETCHING |
| STEP 7<br>UPPER INSULATING LAYER | INORGANIC INSULATING LAYER ACCUMULATION |
| | ORGANIC INSULATING LAYER (PHOTOLITHOGRAPHY STEP) |
| STEP 8<br>COMMON ELECTRODE | FIRST TRANSPARENT CONDUCTIVE FILM ACCUMULATION |
| | PHOTOLITHOGRAPHY STEP |
| | FIRST TRANSPARENT CONDUCTIVE FILM ETCHING |
| STEP 9<br>DIELECTRIC LAYER | DIELECTRIC LAYER ACCUMULATION |
| | PHOTOLITHOGRAPHY STEP |
| | DIELECTRIC LAYER/INORGANIC INSULATING LAYER ETCHING |
| STEP 10<br>PIXEL ELECTRODE | SECOND TRANSPARENT CONDUCTIVE FILM ACCUMULATION |
| | PHOTOLITHOGRAPHY STEP |
| | SECOND TRANSPARENT CONDUCTIVE FILM ETCHING |

ACTIVE MATRIX SUBSTRATE AND DISPLAY DEVICE

BACKGROUND

1. Field

The present disclosure relates to an active matrix substrate and a display device provided with the active matrix substrate.

2. Description of the Related Art

An active matrix substrate used in a display device includes a display region including a plurality of pixel regions and a non-display region other than the display region (also referred to as a "picture-frame region" or a "peripheral region"). The pixel region is a region corresponding to a pixel of the display device. A thin film transistor (hereinafter referred to as "TFT") is disposed as a switching element in each pixel region.

In recent years, it has been proposed to use an oxide semiconductor instead of amorphous silicon or polycrystalline silicon as a material for an active layer of the TFT. Such a TFT is referred to as an "oxide semiconductor TFT". The oxide semiconductor has higher mobility than that of the amorphous silicon. Therefore, the oxide semiconductor TFT can operate at higher speed than that of an amorphous silicon TFT. Since an oxide semiconductor film is formed by a simpler process than that of a polycrystalline silicon film, the oxide semiconductor film can be applied to an apparatus which demands a large area.

Most oxide semiconductor TFTs are bottom gate type TFTs, and a top gate type oxide semiconductor TFT has also been proposed. For example, International Publication NO. 2017/085591 discloses a top gate type TFT in which a gate electrode is disposed on a portion of an oxide semiconductor layer via a gate insulating layer.

A drive circuit such as a gate driver may be monolithically (integrally) formed in the non-display region of the active matrix substrate. By forming the drive circuit monolithically, cost reduction is realized by narrowing the non-display region and simplifying a mounting step. For example, a gate driver circuit may be formed monolithically, and a source driver circuit may be mounted by a chip on glass (COG) method in the non-display region.

For a device such as a smart phone with a high demand for frame narrowing, it is proposed to monolithically form a demultiplexer circuit such as a source switching (Source Shared Driving: SSD) circuit in addition to the gate driver (for example, International Publication NO. 2017/085591). The SSD circuit is a circuit that distributes a display signal from one video signal line from each terminal of the source driver to a plurality of source bus lines. By mounting the SSD circuit, a region (terminal portion forming region) where the terminal portion is disposed in the non-display region can be further narrowed. Since the number of outputs from the source driver is reduced and a circuit scale can be reduced, the cost of a driver IC can be reduced.

A peripheral circuit such as a drive circuit and an SSD circuit includes a TFT. In the present specification, a TFT disposed as a switching element in each pixel of the display region is referred to as a "pixel TFT", and a TFT constituting a peripheral circuit is referred to as a "circuit TFT". Among the circuit TFTs, a TFT used as a switching element in the SSD circuit is referred to as a "SSD circuit TFT", and a TFT used in the gate driver circuit is referred to as a "gate driver circuit TFT". In an active matrix substrate using an oxide semiconductor TFT as a pixel TFT, it is desired to form an oxide semiconductor TFT using the same oxide semiconductor film as the pixel TFT as a circuit TFT from the viewpoint of the manufacturing process.

As a result of a study by the present inventor, in a portion of the TFTs formed on the active matrix substrate, there is a possibility that a threshold voltage may shift in the positive direction (positive shift) by driving the active matrix substrate. As a result, desired TFT characteristics are not obtained, and the reliability of the active matrix substrate may decrease. For example, in the SSD circuit TFT or a portion of the gate driver circuit TFTs, the positive shift of the threshold voltage is likely to increase. Details will be described later.

According to an aspect of the disclosure, there is provided an active matrix substrate provided with an oxide semiconductor TFT capable of suppressing a positive shift of a threshold voltage.

SUMMARY

The present specification discloses an active matrix substrate and a display device described in the following items.

Item 1

An active matrix substrate that includes a display region having a plurality of pixel regions and a non-display region having a peripheral circuit forming region located around the display region and in which a peripheral circuit is formed, the active matrix substrate including: a substrate; a plurality of source bus lines and a plurality of gate bus lines supported on the substrate; and a plurality of oxide semiconductor TFTs supported on the substrate and that have a plurality of pixel TFTs, each of which is associated with one of the plurality of pixel regions, and a plurality of circuit TFTs constituting the peripheral circuit, in which each of the plurality of oxide semiconductor TFTs has an oxide semiconductor layer having a channel region and a gate electrode disposed on the channel region of the oxide semiconductor layer via a gate insulating layer, the plurality of oxide semiconductor TFTs have a plurality of first TFTs, a plurality of second TFTs, and/or a plurality of third TFTs, each of the plurality of first TFTs has a first light shielding structure in which a first light shielding layer is disposed between the oxide semiconductor layer and the substrate so as to overlap the entire channel region when viewed from a normal direction of the substrate, each of the plurality of second TFTs has a second light shielding structure in which a light shielding layer is not disposed between the oxide semiconductor layer and the substrate, each of the plurality of third TFTs has a third light shielding structure in which a second light shielding layer is disposed between the oxide semiconductor layer and the substrate so as to overlap only a portion of the channel region when viewed from the normal direction of the substrate, and the plurality of first TFTs have the plurality of pixel TFTs, and the plurality of second TFTs and/or the plurality of third TFTs have at least a portion of the plurality of circuit TFTs.

Item 2

A display device including: a display panel; a backlight disposed on a rear side of the display panel; and a frame that holds the display panel and the backlight, in which the display panel has the active matrix substrate according to items 1, a counter substrate disposed so as to face the active matrix substrate, and a liquid crystal layer provided between the active matrix substrate and the counter substrate, the frame includes a panel support portion located between the display panel and the backlight and that supports a peripheral edge portion of the display panel, and the panel support portion includes a light shielding region that blocks light from the backlight and an opening region that allows a portion of the light from the backlight to transmit or pass, and when viewed from a normal direction of the substrate, the opening region overlaps at least a portion of the peripheral circuit forming region.

BRIEF DESCRIPTION OF THE DRAWINGS

FIG. 2A is a plan view illustrating a first TFT in the active matrix substrate;

FIG. 2B is a cross-sectional view illustrating a second TFT in the active matrix substrate;

FIG. 13 is a table illustrating a process flow for describing an example of a method for manufacturing the active matrix substrate.

DESCRIPTION OF THE EMBODIMENTS

Figure 1:
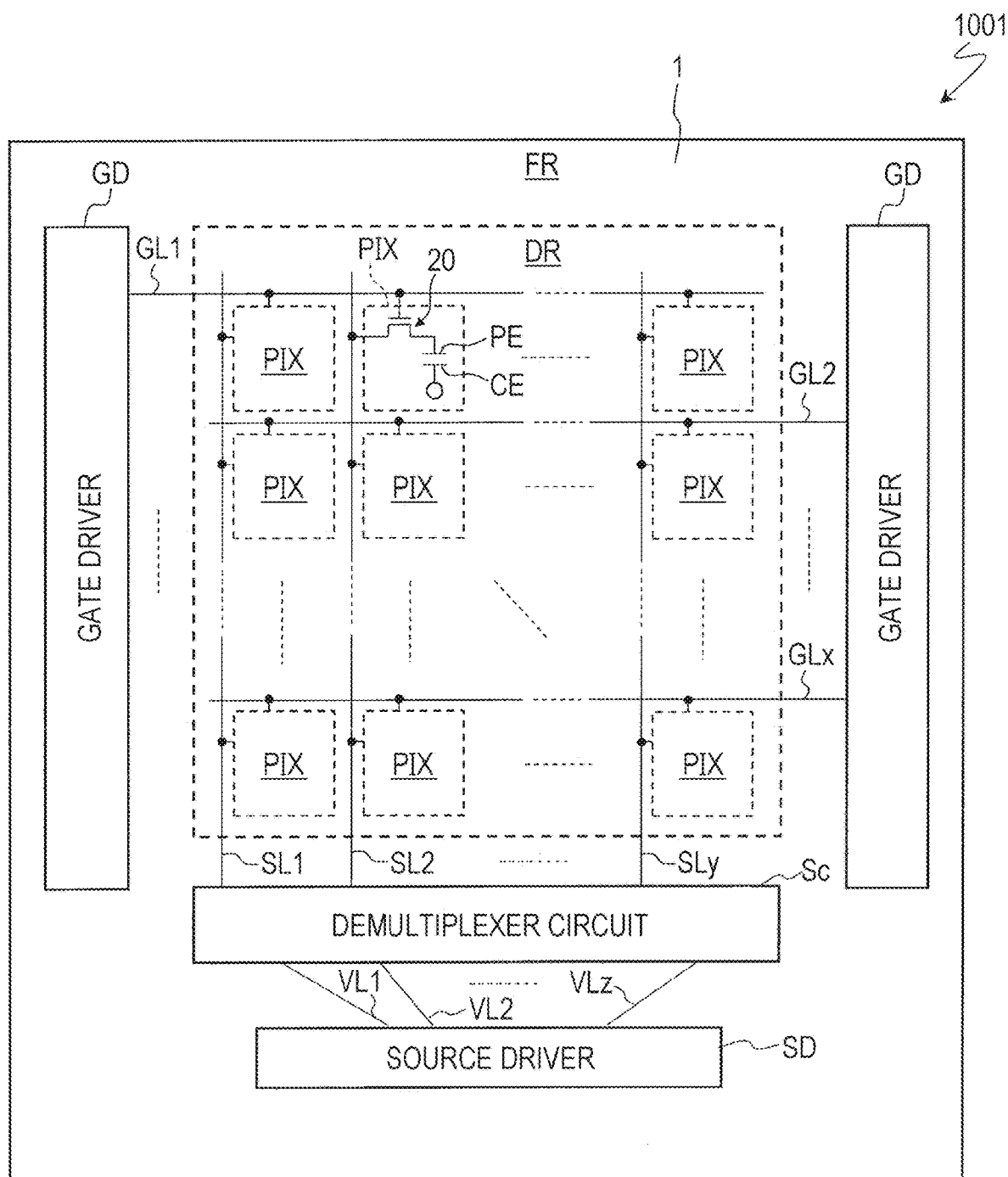
FIG. 1 is a schematic diagram illustrating an example of a planar structure of an active matrix substrate.

As described above, there is a problem that driving of the active matrix substrate causes a positive shift of the threshold voltage in a portion of circuit TFTs, and desired characteristics are not obtained.

As a result of a study by the present inventor, it is found that the above problem is remarkable in the TFT in which a prescribed control signal is applied to the gate at a high duty ratio during the operation of the active matrix substrate. In these TFTs, the ratio of the on-mode period to one cycle (for example, one horizontal scan period) is large. Therefore, it is considered that the positive shift of the threshold voltage is likely to proceed with the operation of the active matrix substrate, and the amount of shift increases. As a result, an operating margin of the TFT is decreased, and in some cases, the TFT may not operate normally.

For example, when driving the active matrix substrate, since a control signal is applied to the gate of the SSD circuit TFT at a high duty ratio (for example, approximately 33% or approximately 50%), the positive shift of the threshold voltage is likely to increase. A relatively large positive shift may occur in a portion of the gate driver circuit TFT (for example, output transistor).

On the other hand, in the oxide semiconductor TFT, when light (for example, backlight light) is incident on the oxide semiconductor layer, there is a problem that oxygen deficiency in the oxide semiconductor increases and the threshold voltage shifts in the negative direction (negative shift). When a negative shift of the threshold voltage occurs, there is a possibility that the off-leak current may increase or depletion (normally-on mode) may occur. On the other hand, in order to suppress deterioration of TFT characteristics (light degradation) due to backlight light, a structure in which a light shielding layer is provided on the substrate side of the oxide semiconductor layer is known in a top gate type oxide semiconductor TFT. In the bottom gate type oxide semiconductor TFT, since the gate electrode provided on the substrate side of the oxide semiconductor layer also functions as a light shielding layer, the light shielding layer may not be provided separately.

As a result of the study based on the above findings, the present inventor found that the positive shift of the threshold voltage can be suppressed by utilizing the characteristics change due to light degradation in the top gate type oxide semiconductor TFT, and thus considered the present disclosure. That is, in the active matrix substrate of the embodiment according to the present disclosure, light degradation is caused by intentionally being incident a prescribed amount of light on the oxide semiconductor layer of a portion of the oxide semiconductor TFTs. As a result, a portion or all of the amount of shift in the positive direction of the threshold voltage generated by the operation of the active matrix substrate can be offset by the amount of shift in the negative direction of the threshold voltage due to light degradation, so that the positive shift of the threshold voltage can be suppressed.

First Embodiment

Hereinafter, an active matrix substrate according to a first embodiment will be described with reference to the drawings.

FIG. 1 is a diagram schematically illustrating an example of a planar structure of an active matrix substrate 1001. The active matrix substrate 1001 includes a display region DR contributing to display and a peripheral region (picture-frame region) FR located outside the display region DR. The display region DR includes a plurality of pixel regions PIX arranged in a matrix. The pixel region PIX (simply, may be referred to as "pixel") is a region corresponding to a pixel of the display device. The non-display region FR is a region located around the display region DR and does not contribute to display.

In the display region DR, the active matrix substrate 1001 is provided with a substrate 1, a plurality of pixel TFTs 20 supported by the substrate 1, a plurality of pixel electrode PEs, a plurality of gate bus lines GL1 to GLx for supplying a gate signal to the pixel TFT 20 (x is an integer of 2 or more, hereinafter collectively referred to as "gate bus line GL"), and a plurality of source bus lines SL1 to SLy for supplying a source signal to the pixel TFT 20 (y is an integer of 2 or more, hereinafter collectively referred to as "source bus line SL"). Each of the pixel regions PIX is defined by, for example, the gate bus line GL and the source bus line SL. The source bus line SL extends in a direction intersecting with the gate bus line GL.

Each of the pixel TFTs 20 and each of the pixel electrodes PE are provided corresponding to one of a plurality of pixel regions PIX. The gate electrode of the pixel TFT 20 is electrically connected to one of the gate bus lines GL, and the source electrode is electrically connected to one of the source bus lines SL. A drain electrode is electrically connected to the pixel electrode PE.

In a case where the active matrix substrate 1001 is applied to a display device of a horizontal electric field mode such as a fringe field switching (FBS) mode, the active matrix substrate 1001 is provided with a common electrode CE for a plurality of pixels PIX.

In the non-display region FR, a peripheral circuit such as a driver can be provided. For example, a gate driver GD driving the gate bus line GL and an SSD circuit Sc driving the source bus line SL in a time-division manner are monolithically formed. For example, the SSD circuit Sc is connected to a source driver SD mounted by a chip on glass (COG) method.

The SSD circuit Sc is disposed between the source driver SD and the display region DR. The source driver SD includes a plurality of output terminals (not illustrated). A plurality of signal output lines (video signal lines) VL1 to VLz (z is an integer of 2 or more, hereinafter collectively referred to as "signal output line VL") are provided in a region located between the source driver SD and the SSD circuit Sc. The SSD circuit Sc distributes the display signals supplied from one signal output line VL to two or more source bus lines SL (z<y). As a result, the number of output terminals (output pins) of the source driver SD can be reduced, so that the area of the non-display region FR can be reduced (frame narrowing).

Structure of Oxide Semiconductor TFT

The active matrix substrate 1001 includes a plurality of oxide semiconductor TFTs. All of the plurality of oxide semiconductor TFTs are top gate type oxide semiconductor TFTs having an oxide semiconductor layer as an active layer. These oxide semiconductor TFTs include a plurality of pixel TFTs 20 and a plurality of circuit TFTs constituting peripheral circuits such as SSD circuits and gate driver circuits.

The plurality of oxide semiconductor TFTs in the present embodiment also includes a plurality of first TFTs and a plurality of second TFTs. The first TFT has a first light shielding structure having a light shielding layer on the substrate 1 side of the oxide semiconductor layer. The light shielding layer is disposed so as to overlap the entire channel region of the oxide semiconductor layer when viewed from the normal direction of the substrate 1. On the other hand, the second TFT has a second light shielding structure in which the light shielding layer is not provided on the substrate 1 side of the oxide semiconductor layer. In the second TFT, light (for example, backlight light) is likely to be incident on the oxide semiconductor layer from the substrate 1 side.

The first TFT includes a pixel TFT. The pixel TFT is desired to have a small off-leak current. This is because when the off-leak current is large, there is a possibility that the holding characteristics of the potential written on the pixel electrode deteriorates, which may cause display defects such as uneven brightness and flicker. Since the pixel TFT has the first light shielding structure, the negative shift of the threshold voltage due to light degradation can be suppressed, so that the increase in off-leak current can be suppressed. The first TFT may further include a portion of the circuit TFT.

The second TFT includes at least a portion of the circuit TFTs among the plurality of circuit TFTs. The second TFT may include, for example, an SSD circuit TFT. Since the control signal is applied to the SSD circuit TFT at a relatively high duty ratio, the amount of shift of the threshold voltage in the positive direction is likely to increase. By applying the second light shielding structure to such a TFT, it is possible to reduce the amount of shift of the threshold voltage in the positive direction by utilizing the negative shift of the threshold voltage due to light degradation. The second TFT may include a gate driver circuit TFT in addition to or instead of the SSD circuit TFT.

Hereinafter, the structure of each TFT will be described in detail by taking as an example a case where the first TFT is a pixel TFT and the second TFT is a circuit TFT with reference to the drawings. Here, an active matrix substrate applied to the display device in the FFS mode will be described as an example. The FFS mode is a lateral electric field mode in which a pair of electrodes is provided on one substrate and an electric field is applied to liquid crystal molecules in a direction (lateral direction) parallel to a substrate surface. The active matrix substrate of the present embodiment may be applied to a display device in a vertical electric field type mode (for example, TN mode or vertical orientation mode) in which a voltage is applied in the thickness direction of the liquid crystal layer.

FIGS. 2A and 2B are schematic cross-sectional views illustrating a first TFT 100 and a second TFT 200, respectively.

The first TFT 100 and the second TFT 200 are supported by the substrate 1. Here, the first TFT 100 is a pixel TFT disposed in each pixel region PIX in the display region DR. The second TFT 200 is a circuit TFT that constitutes a peripheral circuit disposed in the non-display region FR.

The first TFT 100 includes a light shielding layer 103 disposed on the substrate 1, an oxide semiconductor layer 107 disposed on the light shielding layer 103 via a lower insulating layer 5, the gate insulating layer 109 disposed on the oxide semiconductor layer 107, a gate electrode GE1 disposed on the gate insulating layer 109, a source electrode SE1, and a drain electrode DE1.

The oxide semiconductor layer 107 has a channel region 107c that overlaps the gate electrode GE1, and a first region and a second region that are located on both sides of the channel region 107c, respectively, when viewed from the normal direction of the principal surface of the substrate 1. A portion of the first region 107s (source contact region) is electrically connected to the corresponding source bus line SL via the source electrode SE1. A portion of the second region (drain contact region) 107d is electrically connected to the pixel electrode PE via the drain electrode DE. The first region and the second region are low resistance regions having a lower specific resistance than that of the channel region 7c. The first region and the second region may be a conductor region.

The light shielding layer 103 is disposed so as to overlap the entire channel region 107c of the TFT 100 when viewed from the normal direction of the substrate 1. As a result, deterioration of characteristics of the oxide semiconductor layer 7 due to light (backlight light) 130 from the substrate 1 side can be suppressed more effectively. The light shielding layer 103 may be disposed so as to overlap the entire oxide semiconductor layer 107 or the entire portion of the oxide semiconductor layer 107 located between the source contact region 107s and the drain contact region 107d when viewed from the normal direction of the substrate 1.

The light shielding layer 103 may function as a lower electrode of the TFT 100. For example, the light shielding layer 103 may be electrically connected to the gate electrode GE1 (or corresponding gate bus line GL). Alternatively, the light shielding layer 103 may be fixed at a fixed potential (for example, source potential).

For example, the gate insulating layer 109 is disposed so as to cover a portion of the oxide semiconductor layer 107 (here, channel region 107c) and not to cover the first region and the second region. The gate insulating layer 109 may be located only between the oxide semiconductor layer 107 and the gate electrode GE1. When viewed from the normal direction of the substrate 1, a peripheral edge of the gate insulating layer 109 (in a case where the gate insulating layer 109 has a tapered shape, peripheral edge of the upper surface of the gate insulating layer 109) may be aligned with a peripheral edge of the gate electrode GE1. Such a structure can be obtained by patterning the gate insulating layer 109 by using a mask for patterning the gate electrode GE1 or using the gate electrode GE1 as a mask.

The gate electrode GE1 is disposed so as to overlap the channel region 107c of the oxide semiconductor layer 107 when viewed from the normal direction of the substrate 1. The gate electrode GE1 is formed by using, for example, the same conductive film (gate conductive film) as that of the gate bus line GL. In the present specification, a layer including electrodes and wiring formed by using a gate conductive film is referred to as a "gate metal layer". The gate electrode GE1 may be integrally formed with (or may be connected to) the gate bus line GL. For example, the gate electrode GE1 may be a portion of the gate bus line GL.

In such a case, a portion of the gate bus line GL overlapping the oxide semiconductor layer 107 when viewed from the normal direction of the substrate 1 is referred to as a "gate electrode GE1".

The oxide semiconductor layer 107, the gate insulating layer 109, and the gate electrode GE1 are covered with an interlayer insulating layer 10. As the interlayer insulating layer 10, a reducing insulating film (for example, silicon nitride film) capable of reducing an oxide semiconductor may be used. As a result, it is possible to suppress an increase in the specific resistance of the portion (first region and second region) of the oxide semiconductor layer 107 in contact with the interlayer insulating layer 10. The interlayer insulating layer 10 is formed with a source opening portion 110s that exposes the source contact region 107s of the first region and a drain opening portion 110d that exposes the drain contact region 107d of the second region.

The source electrode SE1 is formed on the interlayer insulating layer 10 and in the source opening portion 110s, and is connected to the source contact region 107s of the oxide semiconductor layer 7 in the source opening portion 110s. The drain electrode DE1 is formed on the interlayer insulating layer 10 and in the drain opening portion 110d, and is connected to the drain contact region 107d of the oxide semiconductor layer 107 in the drain opening portion 110d. The source electrode SE1 and the drain electrode DE1 may be formed by using the same conductive film as that of the source bus line SL. In the present specification, a layer including electrodes and wiring formed by using a source conductive film is referred to as a "source metal layer". The source electrode SE1 may be integrally formed with (or may be connected to) the source bus line SL. For example, the source electrode SE1 may be a portion of the source bus line SL. In this case, the portion of the source bus line SL1 connected to the oxide semiconductor layer 107 may be referred to as the "source electrode SE1".

In a case where the first TFT 100 is a pixel TFT, the drain electrode DE1 of the first TFT 100 is electrically connected to the pixel electrode PE.

The upper insulating layer 13 is formed so as to cover the first TFT 100. The upper insulating layer 13 includes, for example, an inorganic insulating layer (passivation film) 11. As illustrated in the drawing, the upper insulating layer 13 may have a laminated structure including the inorganic insulating layer 11 and an organic insulating layer 12 formed on the inorganic insulating layer 11. The organic insulating layer 12 may not be formed. Alternatively, the organic insulating layer 12 may be formed only in the display region.

A common electrode CE is formed on the upper insulating layer 13. The common electrode CE may not be separated for each pixel region PIX. For example, the common electrode CE may include an opening portion in the pixel contact region (region where pixel contact hole CHp is formed) connecting the pixel electrode PE and the drain electrode DE, and may be formed over the entire pixel region PIX excluding the pixel contact region.

The pixel electrode PE is disposed on the common electrode CE via the dielectric layer 17. The pixel electrode PE is separated for each pixel region PIX. In each pixel region PIX, the pixel electrode PE is provided with one or a plurality of slits (opening portions) or cutout portions.

The pixel electrode PE is disposed on the dielectric layer 17, and is connected to the drain electrode DE1 in the pixel contact hole CHp formed in the upper insulating layer 13 and the dielectric layer 17. The pixel contact hole CHp is configured to include an opening portion 11p of the inorganic insulating layer 11, an opening portion 12p of the organic insulating layer 12, and an opening portion 17p of the dielectric layer 17. The opening portion 17p at least partially overlaps the opening portion 12p when viewed from the normal direction of the substrate 1.

The opening portion 11p and the opening portion 17p may be formed by collectively etching the dielectric layer 17 and the inorganic insulating layer 11 using the resist mask on the dielectric layer 17 and the organic insulating layer 12 as masks. In this case, the side surface of the opening portion 11p can be aligned with the opening portion 17p or the opening portion 12p in the pixel contact hole CHp.

In the illustrated example, although the pixel electrode PE is formed on the common electrode CE via the dielectric layer 17, the common electrode CE may be formed on the pixel electrode PE via the dielectric layer 17. In this case, in each pixel region PIX, the common electrode CE is provided with a slit or a cutout portion.

The first TFT 100 may not include the drain electrode. In this case, the pixel electrode PE may be directly connected to the drain contact region 107d of the oxide semiconductor layer 107.

Figure 14:
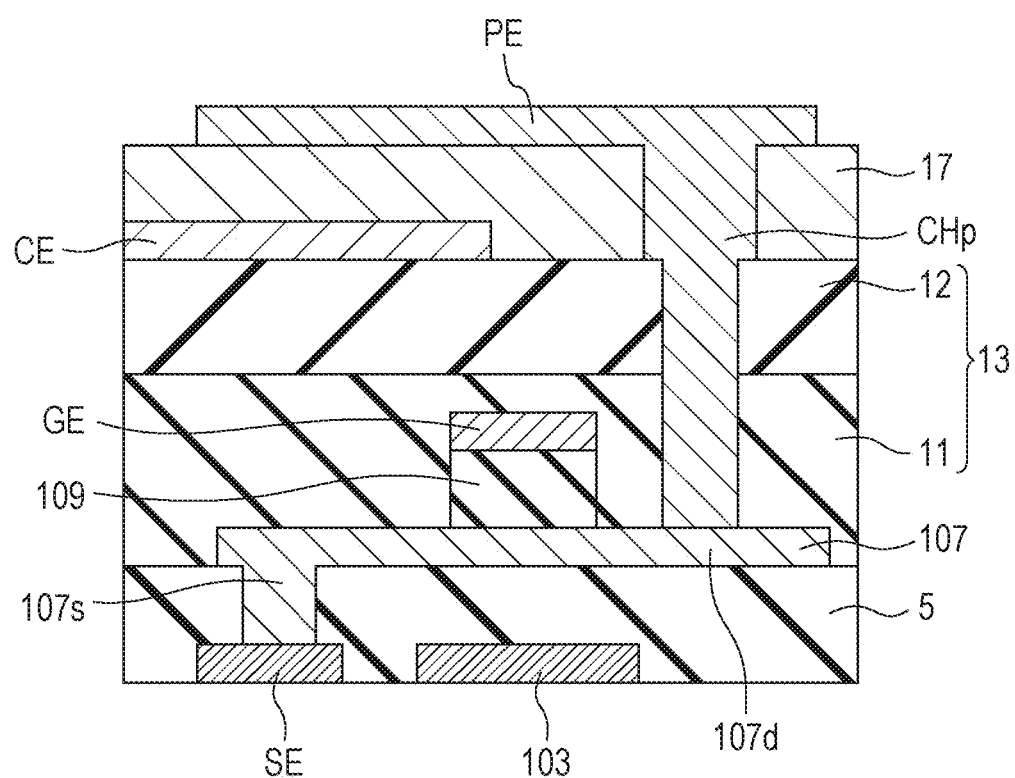
FIG. 14 is a cross-sectional view illustrating another example of the first TFT.

Furthermore, as illustrated in FIG. 14, the source bus line SL and the source electrode SE of the oxide semiconductor TFT may be formed by using the same conductive film as that of the light shielding layer 103. A substrate structure in which the source bus line SL is disposed on the substrate 1 side from the gate metal layer and the oxide semiconductor layer 107 in this manner is referred to as a "lower source structure".

The second TFT 200 may have the same structure as that of the first TFT 100 except that the oxide semiconductor layer 207 does not have a light shielding layer on the substrate 1 side.

The second TFT 200 includes the oxide semiconductor layer 207 disposed on the lower insulating layer 5, a gate insulating layer 209 disposed on the oxide semiconductor layer 207, a gate electrode GE2 disposed on the gate insulating layer 209, a source electrode SE2, and a drain electrode DE2.

The oxide semiconductor layer 207 has a channel region 207c that overlaps the gate electrode GE2 and a first region and a second region located on both sides of the channel region 207c when viewed from the normal direction of the substrate 1. The source electrode SE2 is connected to a portion of the first region (source contact region) 207s of the oxide semiconductor layer 207 in the source opening portion 210s formed in the interlayer insulating layer 10.

The drain electrode DE2 is connected to a portion of the second region (drain contact region) 207d of the oxide semiconductor layer 207 in the drain opening portion 210d formed in the interlayer insulating layer 10. The source electrode SE2, the drain electrode DE2, and the gate electrode GE2 of the second TFT 200 are each electrically connected to a prescribed wiring constituting the circuit. The substrate 1 side of the oxide semiconductor layer 207 is not provided with a structure that blocks light traveling from below the substrate 1 toward the channel region 207c.

In a case where the second TFT 200 is a circuit TFT, the second TFT 200 is provided in the peripheral circuit forming region in the non-display region. The organic insulating layer 12 may not be formed above the second TFT 200. In this example, the second TFT 200 is covered with the inorganic insulating layer 11 and the dielectric layer 17.

Effect

The active matrix substrate 1001 of the present embodiment includes the first TFT 100 having the first light shielding structure and the second TFT 200 having the second light shielding structure. In the first TFT 100 having the first light shielding structure, since the light 130 can be suppressed from being incident on the channel region 107c of the oxide semiconductor layer 107, the negative shift of the threshold voltage due to light degradation can be suppressed.

As a result, high off-characteristics are maintained. On the other hand, in the second TFT 200, the backlight light 130 is incident on the channel region 207c of the oxide semiconductor layer 207 to intentionally cause a negative shift of the threshold voltage due to light degradation. As a result, the amount of shift of the threshold voltage in the positive direction can be offset, so that the change ΔVth of the threshold voltage can be suppressed to be small.

The first TFT 100 may include a pixel TFT that demands high off-characteristics, and the second TFT 200 may include a circuit TFT having a large positive shift of the threshold voltage (for example, SSD circuit TFT). As described above, the reliability can be improved by separately forming the structure of each TFT formed on the active matrix substrate 1001 according to the application.

As described above, in the related art, a portion of circuit TFTs have a problem that the amount of shift of the threshold voltage in the positive direction increases as the active matrix substrate is driven. On the other hand, according to the present embodiment, by applying the second light shielding structure to such a circuit TFT, the positive shift of the threshold voltage can be suppressed.

Evaluation of TFT Characteristics

A sample TFT 1 having a first light shielding structure and a sample TFT 2 having a second light shielding structure were prepared, and the relationship between the application time of the gate voltage (Vg) and the TFT characteristics was investigated.

The sample TFT 1 and the sample TFT 2 have the structures illustrated in FIGS. 2A and 2B, respectively. These sample TFTs have the same structure except for the presence or absence of a light shielding layer.

Here, a gate voltage Vg of +30 V was applied to each TFT in a state where each sample TFT was irradiated with the backlight light (luminous intensity: 4500 cd) from the back surface. The current-voltage characteristics of each sample TFT were measured with a measurement temperature of 60° C. and a Vg stress application time of 0 to 3600 seconds.

Figure 3A:
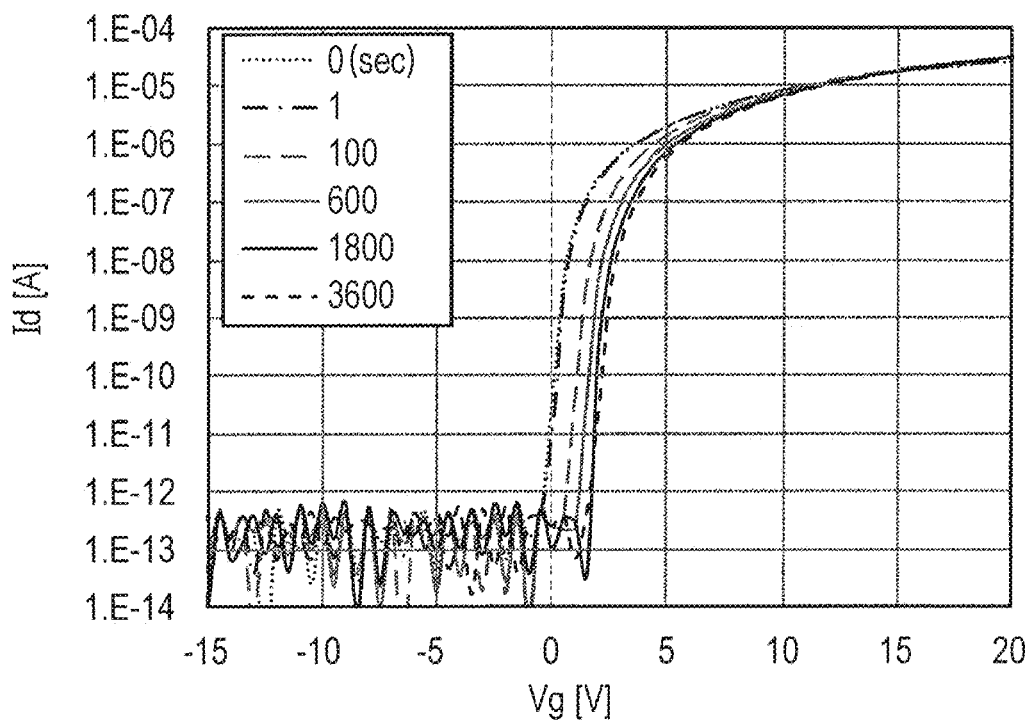
FIG. 3A is a graph illustrating measurement results of current-voltage characteristics in a sample TFT having a first light shielding structure.
Figure 3B:
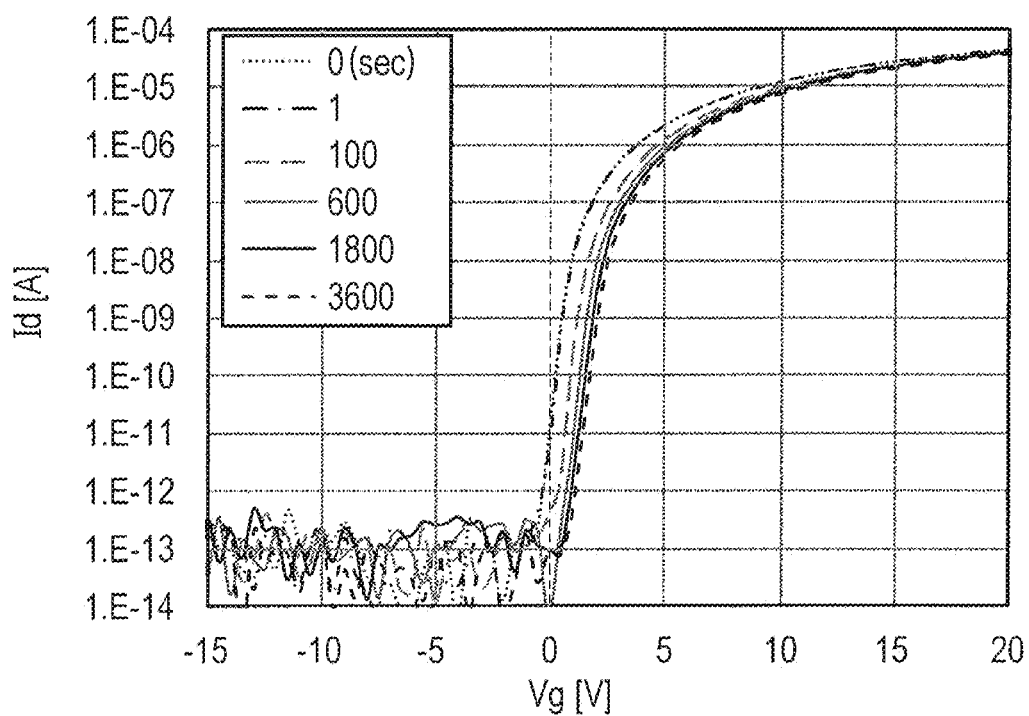
FIG. 3B is a graph illustrating measurement results of current-voltage characteristics in a sample TFT having a second light shielding structure.
Figure 4A:
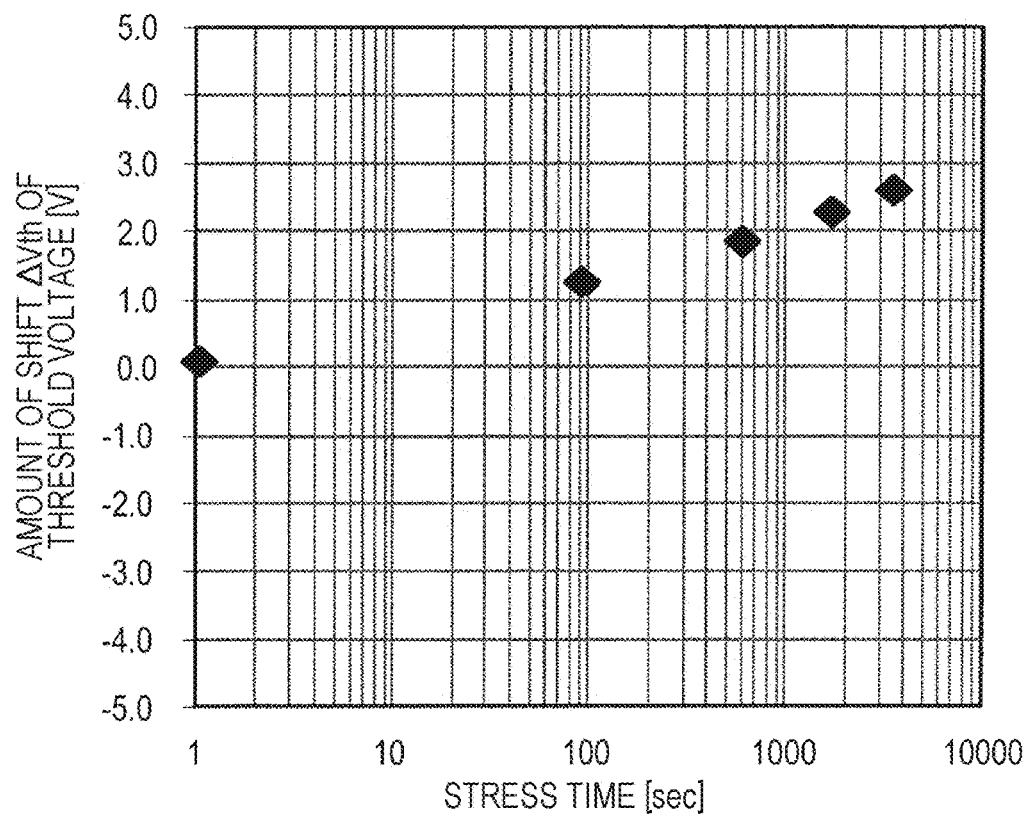
FIG. 4A is a graph illustrating a relationship between a stress application time in the sample TFT and the amount of shift of a threshold voltage.
Figure 4B:
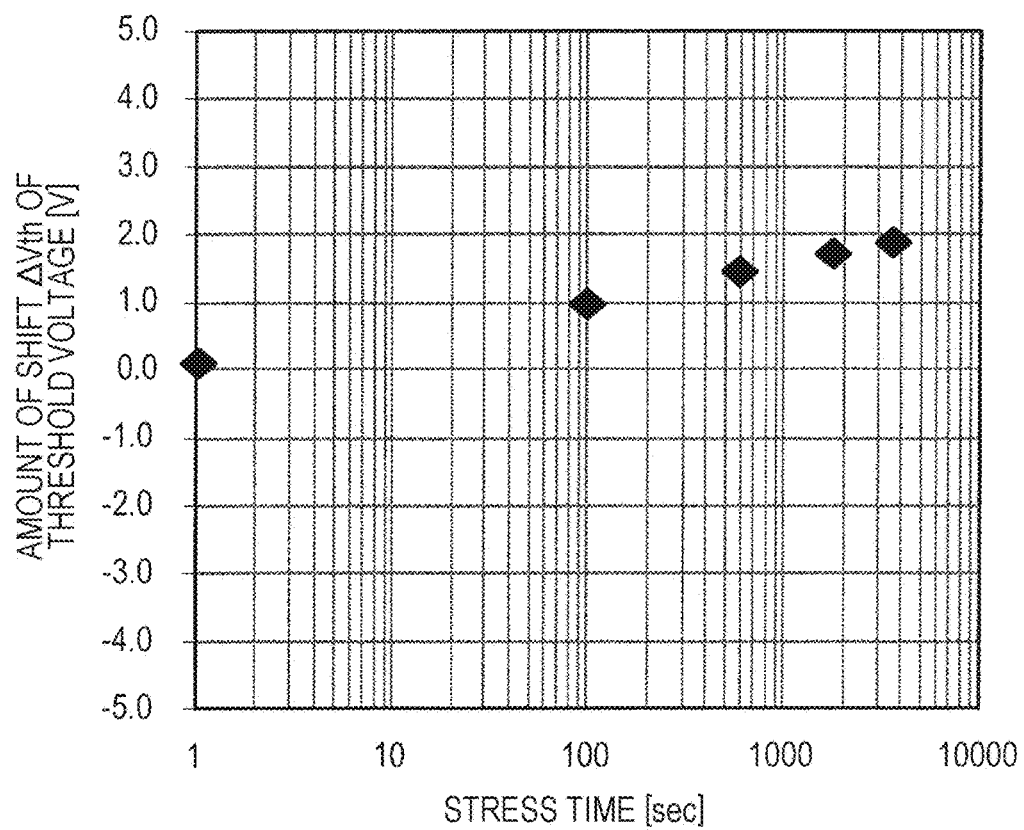
FIG. 4B is a graph illustrating a relationship between a stress application time in the sample TFT and the amount of shift of a threshold voltage.

FIGS. 3A and 3B are diagrams illustrating measurement results of the current-voltage characteristics of the sample TFT 1 and the sample TFT 2, respectively. The horizontal axis represents the gate voltage Vg, and the vertical axis represents the drain current Id. FIGS. 4A and 4B are diagrams illustrating the relationship between the stress application time in the sample TFT 1 and the sample TFT 2 and the amount of shift ΔVth of the threshold voltage, respectively.

From these results, it can be seen that the sample TFT 1 having the light shielding layer has a larger amount of shift ΔVth in the positive direction of the threshold voltage than the sample TFT 2 having no light shielding layer. For example, when the Vg stress application time is 3600 seconds, the amount of shift ΔVth of the sample TFT 1 is approximately +2.5 V, while the amount of shift ΔVth of the TFT of the sample TFT 2 is approximately +1.9 V. It is considered that this is because in the sample TFT2, the amount of shift in the positive direction is reduced as a result of light degradation caused by the backlight light incident on the oxide semiconductor layer and the threshold voltage Vth being shifted on the negative side.

SSD Circuit

Next, an example of the configuration of the SSD circuit will be described with reference to the drawings.

Figure 5:
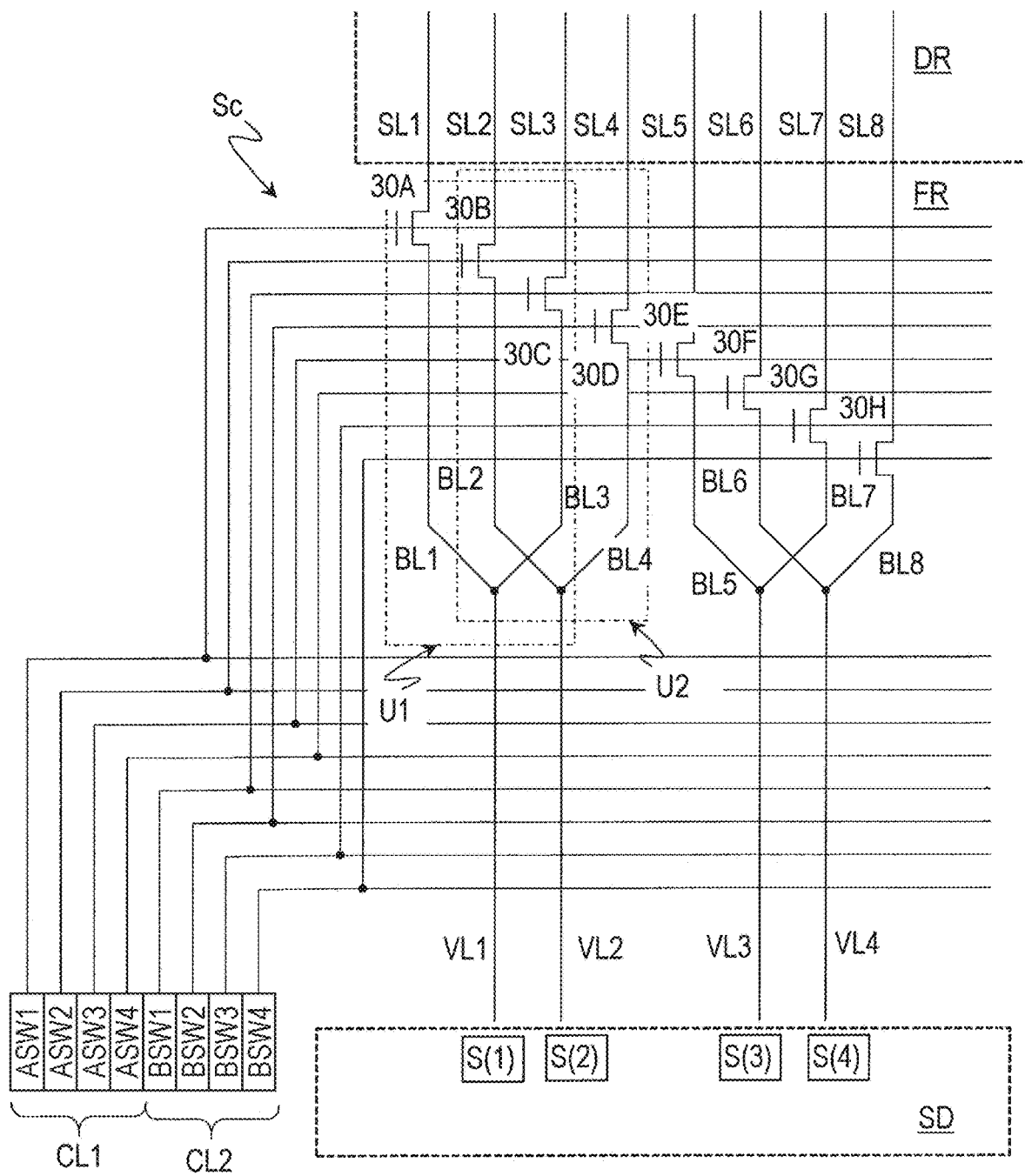
FIG. 5 is a diagram for describing a configuration and operation of an SSD circuit.

FIG. 5 is a diagram for describing the configuration and operation of the SSD circuit Sc in the active matrix substrate 1001 according to the present embodiment.

The SSD circuit Sc is disposed between the source driver SD and the display region DR. The SSD circuit Sc includes a plurality of unit circuits U supported on the substrate 1. Each of the plurality of unit circuits U distributes a display signal from one signal output line VL to n (n is an integer of 2 or more) source bus lines SL. FIG. 5 illustrates a case where n=2, that is, a case where each unit circuit U distributes a display signal from one signal output line VL to two source bus lines SL. Although the SSD circuit has a large number of unit circuits, FIG. 5 illustrates only four unit circuits (referred to as the first unit circuit U1 to the fourth unit circuit U4) for the sake of simplicity.

Each unit circuit U includes n (here, two) branch wirings BL and n (here, two) SSD circuit TFTs (TFTs 30A and 30C in the first unit circuit U1). The two branch wirings BL are connected to one signal output line VL. Each of the two TFTs is connected to each of the two branch wirings BL. These TFTs individually (independently) control on/off the electrical connection between the two branch wirings BL and the two source bus lines SL. In the present embodiment, each of the TFTs is a top gate type oxide semiconductor TFT and has the second light shielding structure illustrated in FIG. 2B.

Hereinafter, the configuration of each unit circuit U will be described more specifically by taking the first unit circuit U1 and the second unit circuit U2 as examples.

The first unit circuit U1 distributes the display signal S(1) from the signal output line VL1 to the source bus lines SL1 and SL3, and the second unit circuit U2 distributes the display signal S(2) from the signal output line VL2 to the source bus lines SL2 and SL4.

One TFT 30A in the first unit circuit U1 controls on/off the electrical connection between the branch wiring BL1 and the source bus line SL1, and the other TFT 30C controls on/off the electrical connection between the branch wiring BL3 and the source bus line SL3. Each of the source electrode and drain electrode of the TFT 30A is connected to the branch wiring BL1 and the source bus line SL1, and each of the source electrode and drain electrode of the TFT 30C is connected to the branch wiring BL3 and the source bus line SL3.

One TFT 30B in the second unit circuit U2 controls on/off the electrical connection between the branch wiring BL2 and the source bus line SL2, and the other TFT 30D controls on/off the electrical connection between the branch wiring BL4 and the source bus line SL4. Each of the source electrode and drain electrode of the TFT 30B is connected to the branch wiring BL2 and the source bus line SL2, and each of the source electrode and drain electrode of the TFT 30D is connected to the branch wiring BL4 and the source bus line SL4.

The SSD circuit Sc also includes n (here, two) control signal trunk lines CL1 and CL2.

In the first unit circuit U1, a selection signal (SSD control signal) ASW1 is supplied from the control signal trunk line (first control signal trunk line) CL1 to the gate electrode of the TFT 30A, and a selection signal (SSD control signal) BSW1 is supplied from the control signal trunk line (second control signal trunk line) CL2 to the gate electrode of the TFT 30C. In the second unit circuit U2, a selection signal ASW2 is supplied from the first control signal trunk line CL1 to the gate electrode of the TFT 30B, and a selection signal BSW2 is supplied from the second control signal trunk line CL2 to the gate electrode of the TFT 30D. These selection signals define the on-period of the selection switch within the same group and are synchronized with the time series signal output from the source driver SD. Each unit circuit U writes the data potential obtained by time-dividing the output of the signal output line VL to the corresponding two source bus lines SL in time series (time-division drive).

Figure 6:
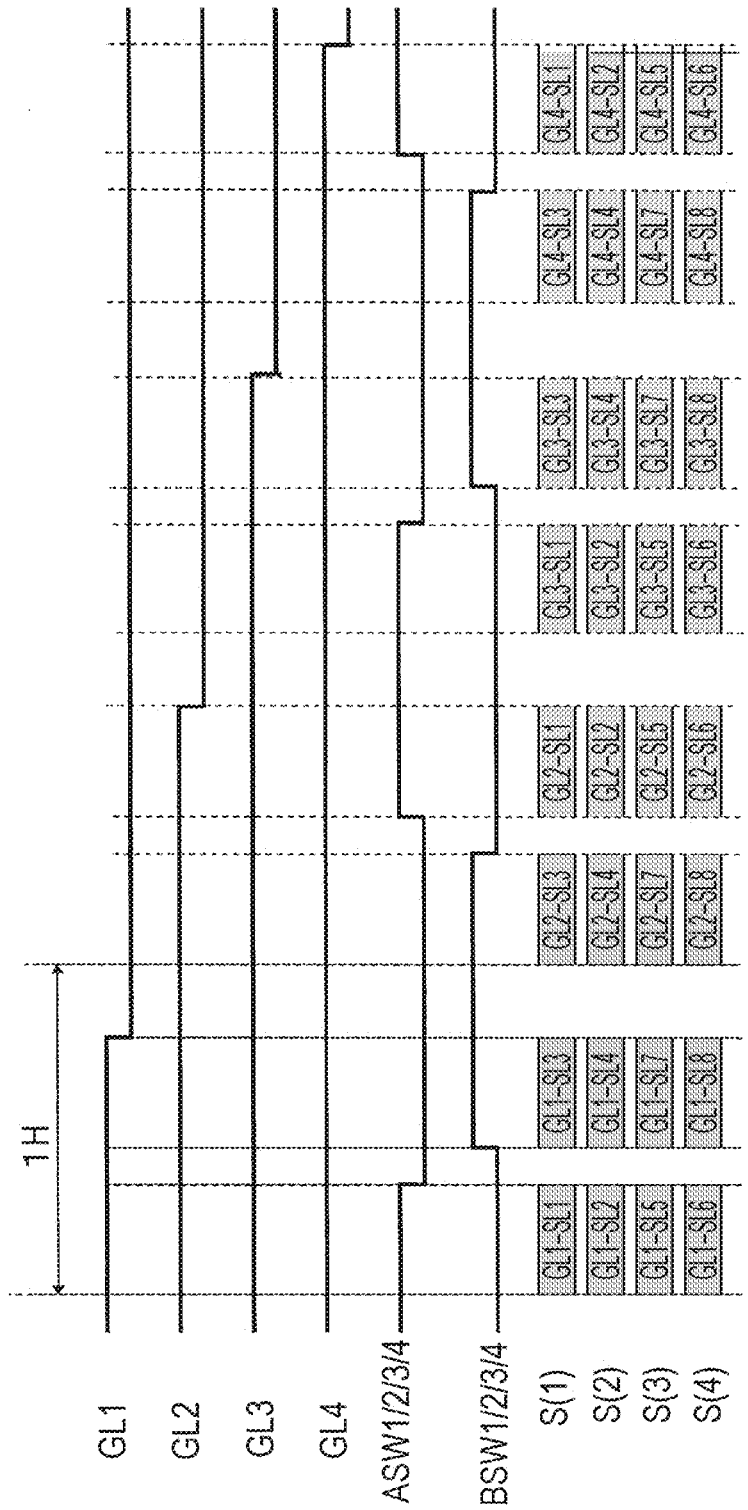
FIG. 6 is a diagram illustrating a timing chart of the SSD circuit.

FIG. 6 is a timing chart illustrating the operation of the SSD circuit Sc. As illustrated in the drawing, in the first horizontal scan period 1H, the best gate bus line GL1 is selected. In this horizontal scan period 1H, the selection signals ASW1 and BSW1 are sequentially turned on, and the two TFTs 30A and 30C in the first unit circuit U1 are sequentially selected, so that the data potentials of two pixels located at the intersection portion of the gate bus line GL1 and the source bus lines SL1 and SL3 are sequentially output to the signal output line VL1. Similarly, the data potentials of two pixels located at the intersection portions of the gate bus line GL1 and the source bus lines SL2 and SL4 are sequentially output to the signal output line VL2. The same applies to other signal wiring. The selection signals ASW1 to ASW4 are supplied by the common first control signal trunk line CL1, and the selection signals BSW1 to BSW4 are supplied by the common second control signal trunk line CL2.

Since each of the gate electrodes of the two TFTs 30 in each unit circuit U is connected to the first control signal trunk line CL1 and the second control signal trunk line CL2, a prescribed voltage is applied with a high duty ratio of approximately 50%. Therefore, these TFTs 30 are likely to generate characteristics shift in which the threshold voltage shifts in the positive direction as the operation is performed. However, in the present embodiment, each TFT 30 has a structure (second light shielding structure) in which light is incident on the oxide semiconductor layer from the substrate 1 side. Therefore, when the active matrix substrate is operated, backlight light is incident on the oxide semiconductor layer of each TFT 30 from the substrate 1 side, and a negative shift of the threshold voltage due to the light may occur. As a result, a portion or all of the amount of shift of the threshold voltage of the TFT 30 in the positive direction is offset, so that the change in the TFT characteristics can be suppressed.

The SSD circuit of the present embodiment is not limited to the configurations illustrated above, and may have various configurations. For example, each unit circuit U may be disposed for three source bus lines SL associated with R, G, and B pixels (that is, n=3). In this case, a prescribed voltage is applied to each of the gate electrode of the three TFTs 30 in each unit circuit U at a high duty ratio of approximately 33%. Therefore, a positive shift of the threshold voltage is likely to occur, and similar to the above example, the amount of shift of the threshold voltage can be reduced by intentionally being incident light on the oxide semiconductor layer of the TFT 30.

In the present specification, for reference, the entire contents disclosed in Japanese Unexamined Patent Application Publication No. 2008-225036, Japanese Unexamined Patent Application Publication No. 2006-119404, and International Publication No. 2011/118079 are incorporated for the operation of the display device using the SSD circuit Sc, the timing chart of the time-division drive, and the like.

Gate Driver Configuration

An example of the configuration of the gate driver GD monolithically formed on the active matrix substrate 1001 will be described.

The gate driver GD includes a shift register having a plurality of stages. Each stage of the shift register is provided so as to correspond to one corresponding pixel row in the display region (a plurality of pixel rows in the case of double gate drive). Each stage of the shift register is a bistable circuit that is in one of two modes at each point of time and outputs a signal indicating the mode (hereinafter referred to as "mode signal"). The mode signal output from each stage of the shift register is applied to the corresponding gate bus line as a scanning signal.

In this example, each bistable circuit is provided with an input terminal for receiving a first clock CKA, a fourth clock CKD, a clear signal CLR, a reference potential VSS, a set signal S, and a reset signal R, and an output terminal for outputting a mode signal Q. Furthermore, the mode signal Q output from the two previous stages is applied as the set signal S, and the mode signal Q output from the three subsequent stages is applied as the reset signal R. That is, focusing on the k-th stage, a scanning signal Gout (k−2) applied to the gate bus line on the (k−2)-th row is applied as the set signal S, and the scanning signal Gout (k+3) applied to the gate bus line on the (k+3)-th row is applied as the reset signal R. A gate start pulse signal GSP is applied as a set signal S to the bistable circuits of the first and second stages of the shift register. A clear signal CLR is applied as a reset signal R to the bistable circuit of the final three stages of the shift register. Of the bistable circuits, the first and final three stages are dummy circuits, and the circuits (k=2 to 1+x) from the second stage to the (1+x)-th stage are connected to the gate bus lines GL1 to GLx, respectively.

In the above configuration, when the pulse of the gate start pulse signal GSP as the set signal S is applied to the first stage of the shift register, the pulses included in the gate start pulse signal GSP (this pulse is included in the mode signal Q output from each stage) are sequentially transferred from the first stage to the final stage based on each clock signal. In response to the transfer of this pulse, the mode signal Q output from each stage becomes a high level in sequence. The mode signal Q output from each stage is applied to each gate bus line GL as a scanning signal Gout (k).

Figure 7:
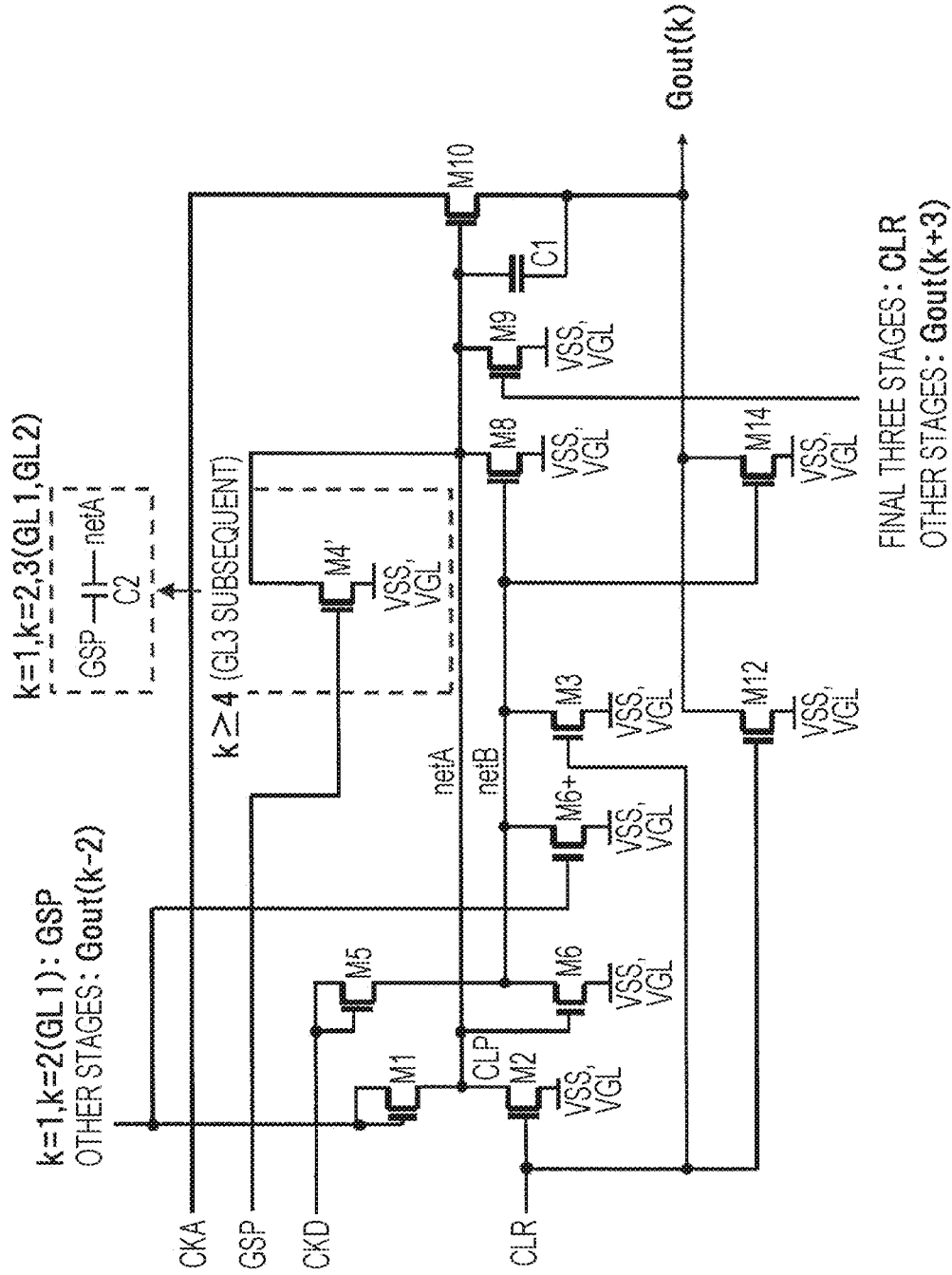
FIG. 7 is a circuit diagram illustrating a configuration of a bistable circuit included in a shift register (configuration of a k-th stage of the shift register)

FIG. 7 is a circuit diagram illustrating the configuration of a bistable circuit SRk included in the shift register (configuration of a k-th stage of the shift register). As illustrated in the drawing, the bistable circuit SRk is provided with a plurality of (here, 12) TFTs and one capacitor C1. The plurality of TFTs includes transistors M2, M3, M12 (also referred to as clear transistors) in which a clear signal CLR is input to the gate electrode, and the transistor M10 (also referred to as an output transistor) that outputs an output signal Gout (k), a transistor M1 to which a set signal (Gout (k−2), GSP in the case of k=1, k=2) is input to the gate electrode and the drain electrode (that is, diode connection), and a transistor M8 (also referred to as a pull-down transistor) in which the source or drain electrode is electrically connected to the gate electrode of the output transistor M10. A node connected to the gate electrode of the transistor M10 is referred to as a net A, and node connected to the gate electrode of the transistor M8 is referred to as net B. The source electrode of transistor M1 is connected to net A. The bistable circuit SRk also includes transistors M3, M6, M6+ in which the drain electrodes are connected to net B.

Figure 8:
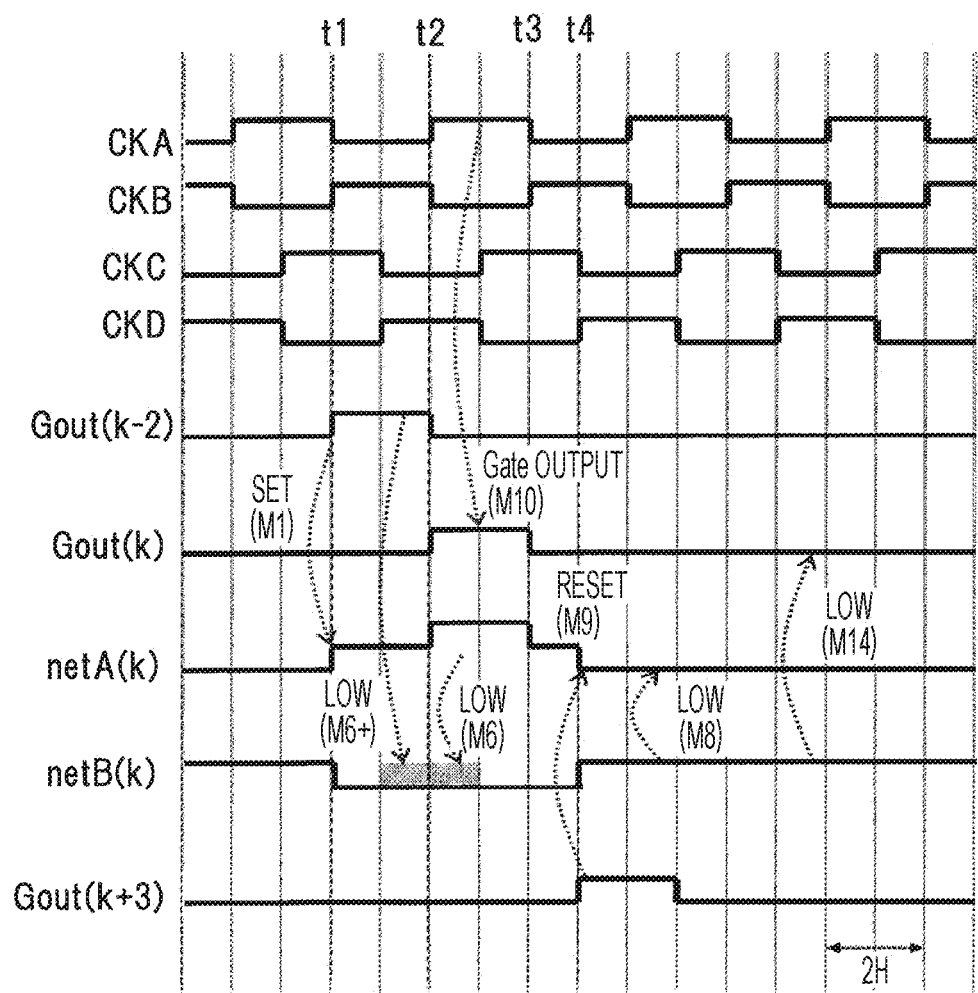
FIG. 8 is a timing chart of each bistable circuit of the shift register.

FIG. 8 is a timing chart of each bistable circuit of the shift register. At the point of time t1, a pulse of Gout (k−2) is applied to the transistor M1 as a set signal. As a result, the potential of net A changes from a low level to a high level. The transistor M6+ is on-mode, the potential of net B is at a low level.

At the point of time t2, the first clock CKA changes from a low level to a high level. As a result, the potential of net A rises. As a result, the potential of the scanning signal Gout (k) rises to the high level potential of the first clock CKA, and the gate bus line connected to an output terminal of the bistable circuit is in a selected mode. When the potential of net A rises, the transistor M6 is on-mode, so that the potential of net B is at a low level.

At the point of time t3, the potential of the scanning signal Gout (k) is at a low level. The potential of net A is maintained at a high level, although the potential is lower than that of the period from t2 to t3. At point of time t4, when a pulse of a reset signal (Gout (k+3)) is applied to the gate of the transistor M9, the potential of net A is at a low level.

Among the plurality of transistors described above, it is particularly desired to suppress the characteristics shift of the output transistor M10. Therefore, in the present embodiment, at least the output transistor M10 may have a second light shielding structure. On the other hand, since the positive shift is unlikely to occur, the transistors M3, M6, and M6+in which the drain electrodes are connected to net B may have the first light shielding structure.

The configuration of the gate driver of the present embodiment is not limited to the illustrated example. The present embodiment is applicable to various known gate drivers. For reference, all the disclosure contents of Japanese Unexamined Patent Application Publication No. 2019-138923 and Japanese Unexamined Patent Application Publication No. 2010-192019 are incorporated for the configuration and operation of the gate driver.

Third TFT

The active matrix substrate of the present embodiment may be provided with a third TFT having a third light shielding structure in addition to the second TFT or instead of the second TFT.

Figure 9A:
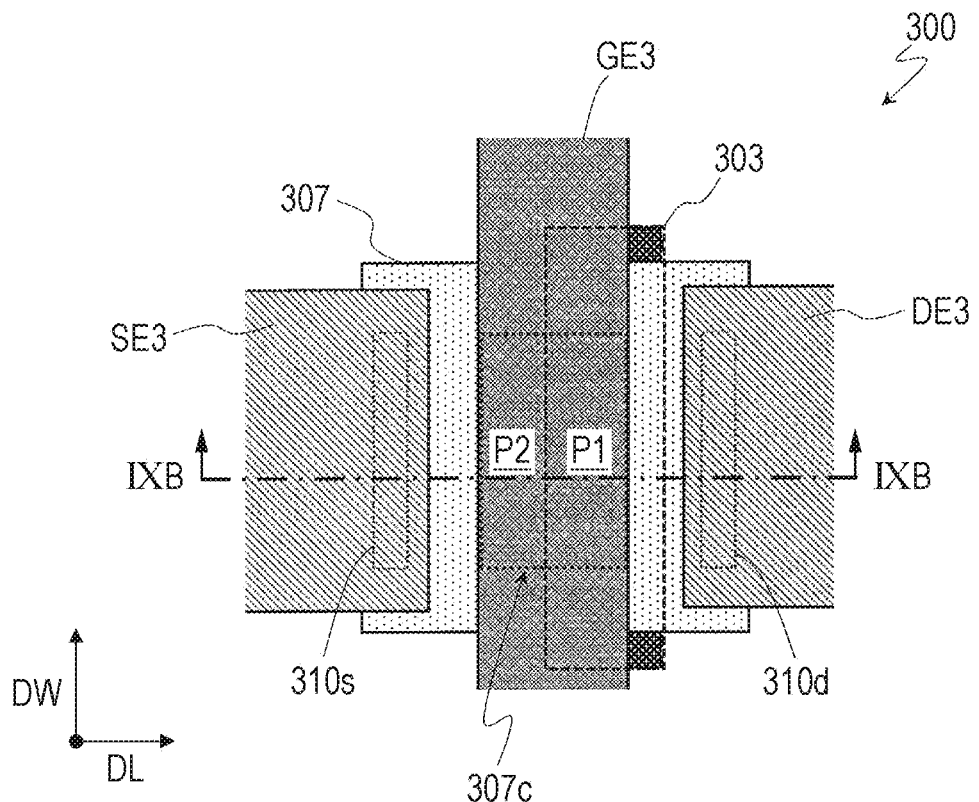
FIG. 9A is a schematic plan view illustrating a third TFT in the active matrix substrate.
Figure 9B:
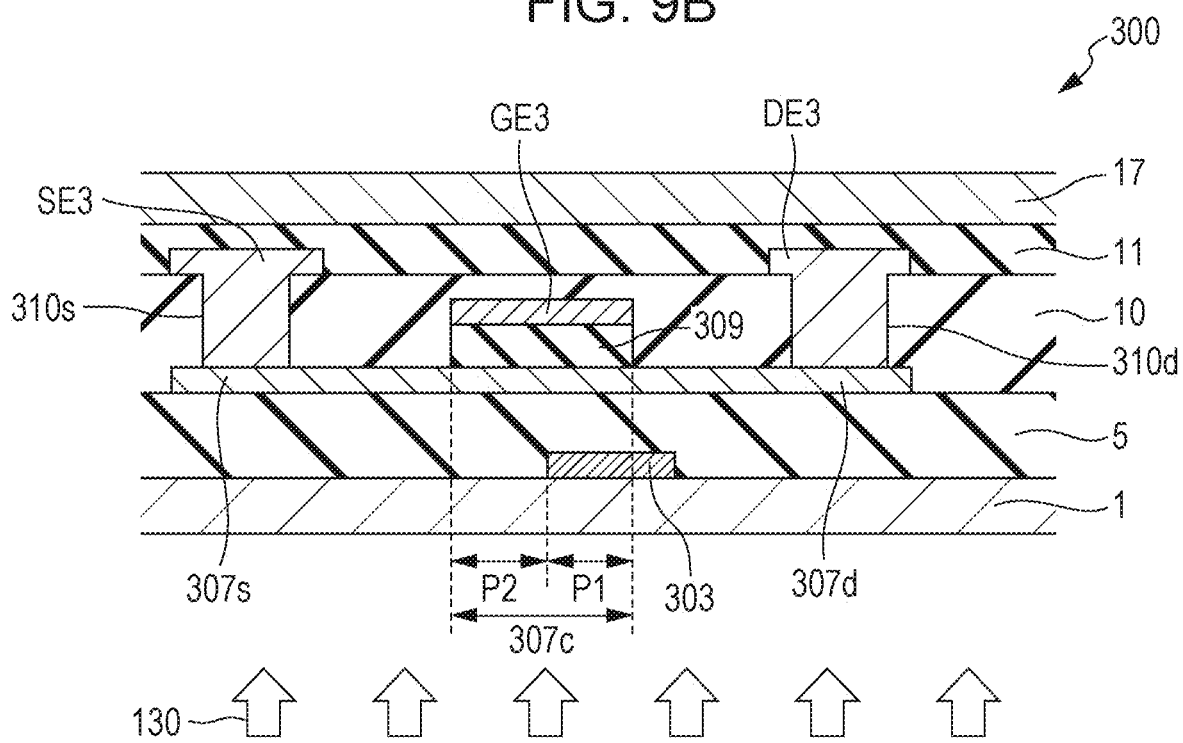
FIG. 9B is a cross-sectional view of the third TFT, illustrating a cross section taken along line IXB-IXB in FIG. 9A.

FIGS. 9A and 9B are a schematic plan view and a cross-sectional view illustrating the third TFT 300, respectively. FIG. 9B illustrates a cross section taken along line IXB-IXB in FIG. 9A. The channel length direction of the third TFT 300 is defined as DL, and the channel width direction is defined as DW.

The third TFT 300 includes a light shielding layer 303 similar to the first TFT 100 illustrated in FIG. 2A. However, the light shielding layer 303 is different from that of the first TFT 100 in that the light shielding layer 303 is disposed so as to overlap only a portion of the channel region 307c of the oxide semiconductor layer 307 when viewed from the normal direction of the substrate 1. Such a structure is referred to as a "third light shielding structure".

When viewed from the normal direction of the substrate 1, a portion P1 of the channel region 307c that overlaps the light shielding layer 303 is referred to as a "light shielding portion", and a portion P2 that does not overlap the light shielding layer 303 is referred to as a "light incident portion". The amount of light incident on the oxide semiconductor layer 307 can be controlled by an area ratio P1/(P1+P2) of the light shielding portion P1 to the entire channel region 307c. The area ratio P1/(P1+P2) (%) is referred to as "light shielding ratio AR" of the channel region 307c. The light shielding ratio AR may be, for example, 25% or more and 75% or less. As illustrated in FIG. 9A, the "channel region 307c" is located between the source contact region 307s connected to the source electrode SE and the drain contact region 307d connected to the drain electrode DE when viewed from the normal direction of the substrate 1, and is referred to a region that overlaps the gate electrode GE when viewed from the normal direction of the substrate 1.

When the second light shielding structure is adopted in the circuit TFT provided on the active matrix substrate, there is a TFT in which the amount of shift of the threshold voltage in the negative direction is larger than the amount of shift in the positive direction, and as a result, the negative shift of the threshold voltage becomes a problem. When the third light shielding structure is applied to such a TFT, the light shielding ratio AR in the channel region 307c can be adjusted according to the application of the TFT and the magnitude of deterioration of characteristics, so that a prescribed threshold voltage can be secured.

As an example, the pixel TFT may have a first light shielding structure (light shielding ratio AR: 100%), the SDD circuit TFT may have a second light shielding structure (light shielding ratio AR:0%), and a portion of the circuit TFTs constituting the gate driver (for example, output transistor) may have a third light shielding structure (light shielding ratio AR:25% or more and 75% or less).

When viewed from the normal direction of the substrate 1, the light shielding layer 303 crosses the channel region 307c in the channel width direction DW, and in the channel region 307c, the light shielding portion P1 and the light incident portion P2 may be disposed in the channel length direction DL. As a result, even when the alignment shift occurs in the channel width direction DW, the desired light shielding ratio AR can be realized. There is an advantage that light from a prescribed direction (light incident portion P2 side) can be selectively obtained.

In this example, the light shielding layer 303 overlaps a portion of the channel region 307c located on the drain side. In the channel region 307c, the light shielding portion P1 is located on the drain side of the light incident portion P2. The light shielding layer 303 may overlap only the portion of the channel region 307c located on the source side when viewed from the normal direction of the substrate 1, and the light shielding portion P1 may be located on the source side of the light incident portion P2 in the channel region 307c.

Modification Example of Third TFT

The arrangement and shape of the light shielding portion P1 in the third TFT are not limited to an example illustrated in FIGS. 9A and 9B.

Figure 10A:
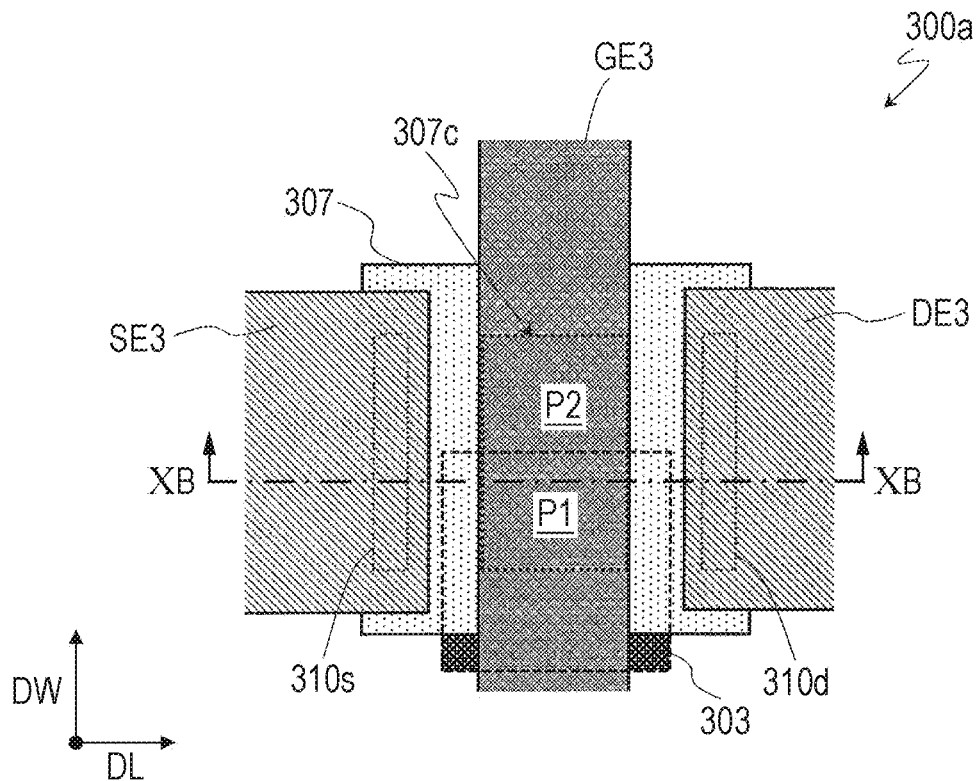
FIG. 10A is a schematic plan view illustrating a third TFT according to Modification Example 1.
Figure 10B:
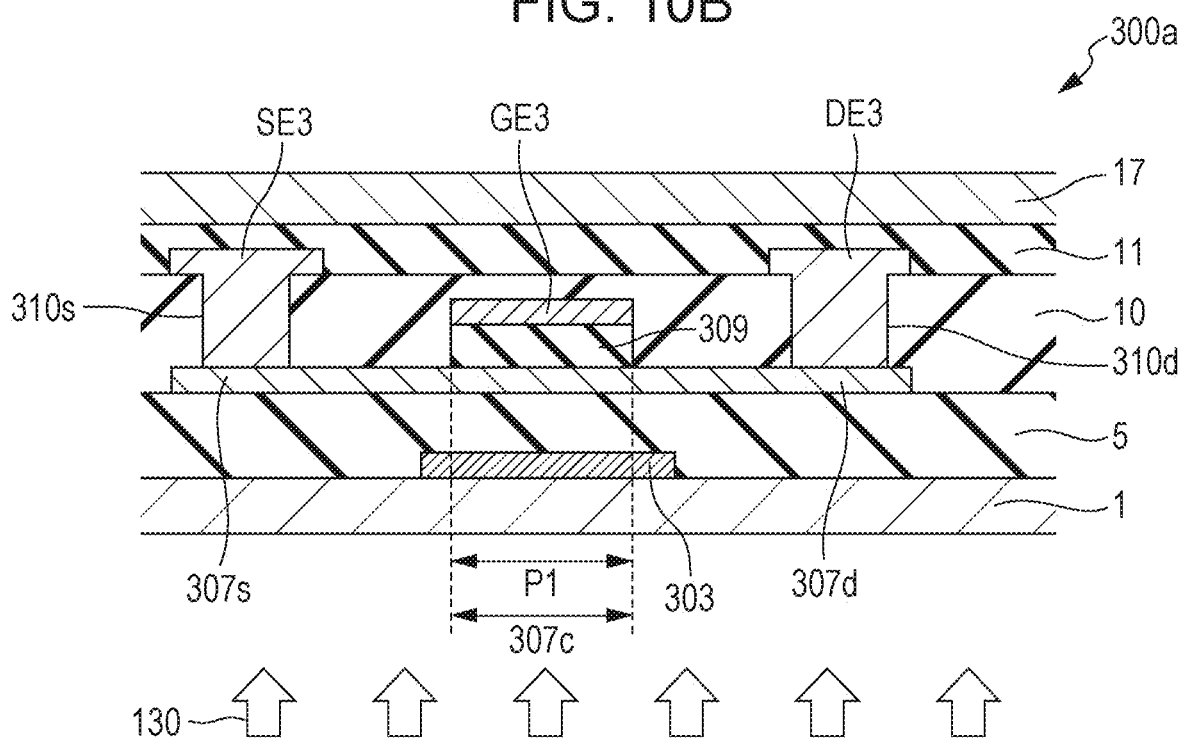
FIG. 10B is a cross-sectional view of the third TFT according to Modification Example 1, illustrating a cross section taken along line XB-XB in FIG. 10A.

FIGS. 10A and 10B are a plan view and a cross-sectional view illustrating a third TFT 300a according to Modification Example 1, respectively. In the third TFT 300a, when viewed from the normal direction of the substrate 1, the light shielding layer 303 crosses the channel region 307c in the channel length direction DL, and the light shielding portion P1 and the light incident portion P2 are disposed in the channel width direction DW in the channel region 307c. In other words, the light shielding portion P1 and the light incident portion P2 each extend in the channel length direction DL. As a result, even when the alignment shift occurs in the channel length direction DL, the desired light shielding ratio AR can be realized. A prescribed direction (light from the light incident portion P2 side) can be selectively obtained.

Figure 11A:
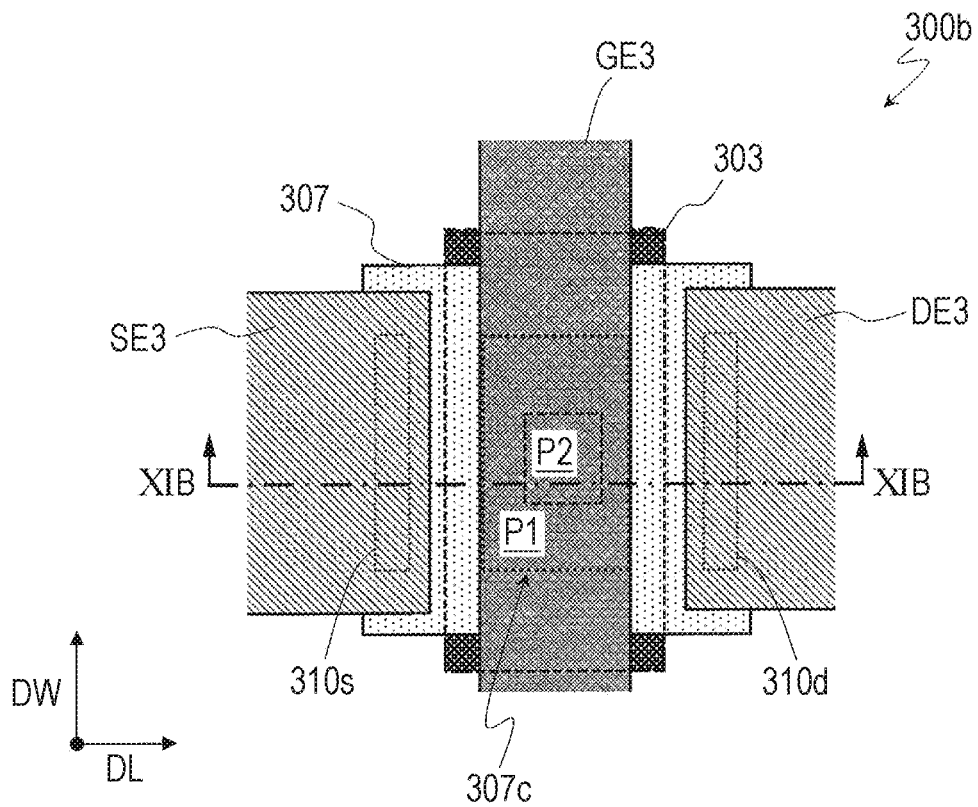
FIG. 11A is a schematic plan view illustrating a third TFT according to Modification Example 2.
Figure 11B:
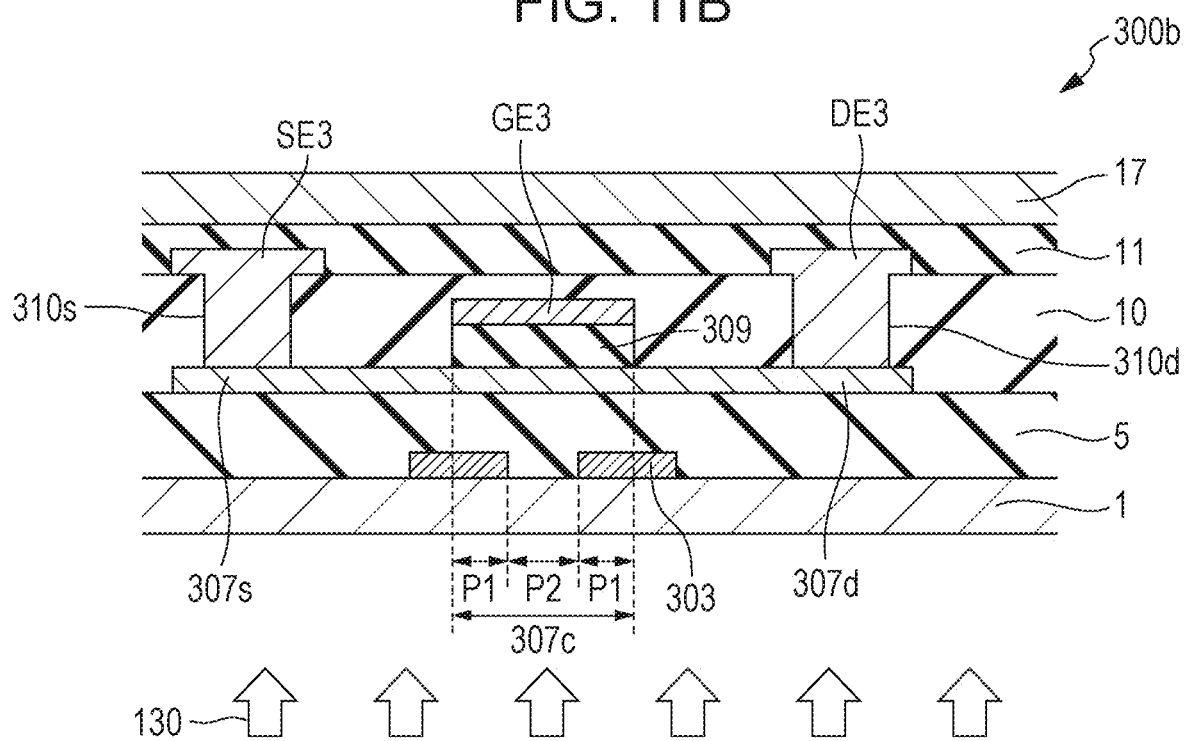
FIG. 11B is a cross-sectional view of the third TFT according to Modification Example 2, illustrating a cross section taken along line XIB-XIB in FIG. 11A.

FIGS. 11A and 11B are a plan view and a cross-sectional view illustrating a third TFT 300b according to Modification Example 2, respectively. The third TFT 300b includes an opening portion in which the light shielding layer 303 overlaps a portion of the channel region 307c when viewed from the normal direction of the substrate 1. In the channel region 307c, the light incident portion P2 exists inside the light shielding portion P1. As a result, there is an advantage that the light shielding portion P1 and the light incident portion P2 can be disposed at a prescribed area ratio AR even when the misalignment occurs.

Display Device Configuration

The active matrix substrate 1001 can be applied to various display devices such as a liquid crystal display device.

Figure 12A:
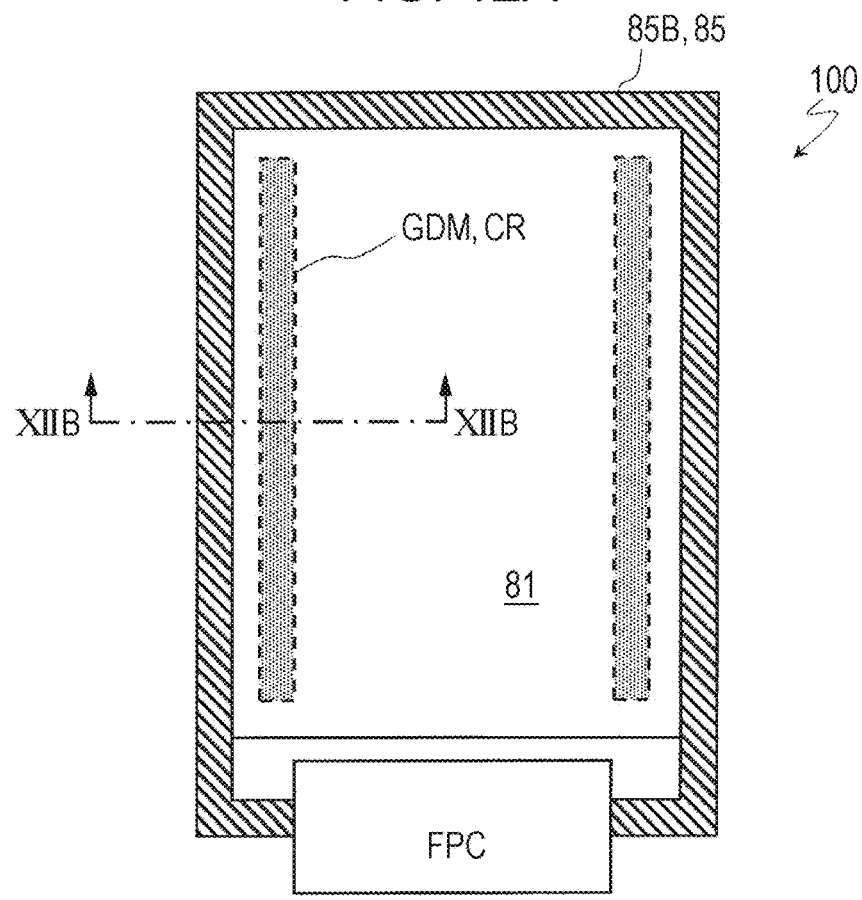
FIG. 12A is a schematic diagram illustrating a display device.
Figure 12B:
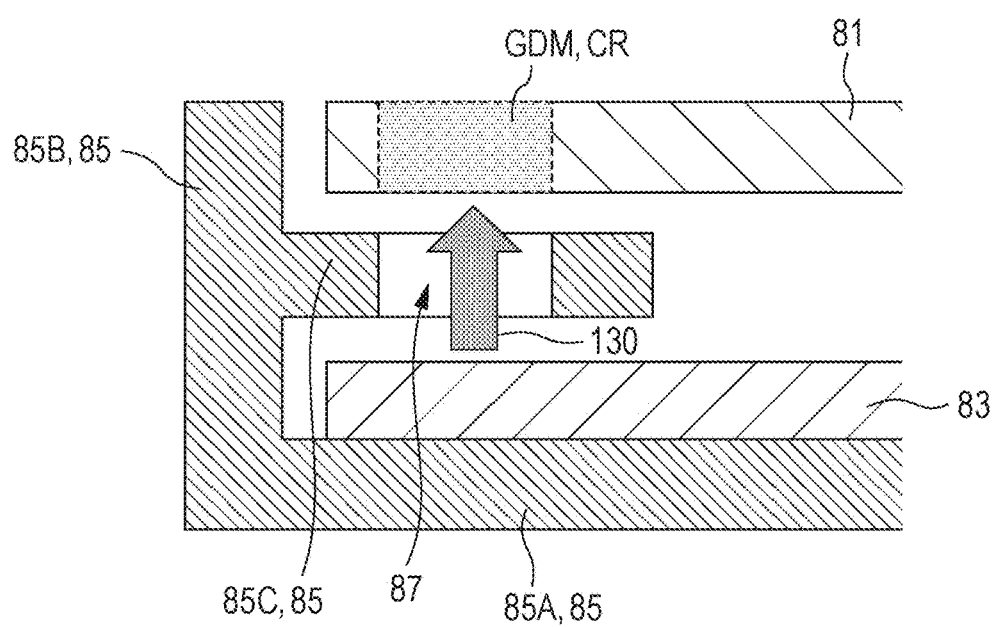
FIG. 12B is an enlarged cross-sectional view of a portion of the display device, illustrating a cross section taken along line XIIB-XIIB illustrated in FIG. 12A.

FIG. 12A is a schematic diagram illustrating a display device 2000 of according to present embodiment. FIG. 12B is an enlarged cross-sectional view of the display device 2000 taken along line XIIB-XIIB illustrated in FIG. 12A.

The display device 2000 is provided with a display panel 81, a backlight 83, and a frame 85.

Although not illustrated, the display panel 81 includes the active matrix substrate 1001, a counter substrate provided with a color filter, a black matrix, and an optical modulation layer disposed between the active matrix substrate 1001 and the counter substrate (for example, liquid crystal layer). The active matrix substrate has a peripheral circuit forming region CR such as a gate driver circuit forming region GDM.

The backlight 83 is disposed on the rear side of the display panel 81 (side opposite to the liquid crystal layer of the active matrix substrate 1001). The backlight 83 may be an edge light type having a light guide plate (also referred to as a sidelight type or a light guide plate type), or a direct type.

The frame 85 holds the backlight 83 and the display panel 81. As illustrated in the drawing, the frame 85 includes a first portion 85A located on the rear side of the backlight 83, a second portion 85B extending from the peripheral edge of the first portion 85A toward the display panel 81, and a panel support portion 85C extending inward from a portion of the second portion 85B and located between the backlight 83 and the display panel 81. The panel support portion 85C supports the peripheral edge portion of the display panel 81. When viewed from the normal direction of the substrate 1, the panel support portion 85C is disposed so as not to overlap the display region of the display panel 81 and to overlap at least a portion of the non-display region (peripheral region). The panel support portion 85C is normally disposed so as to overlap the region (peripheral circuit forming region) CR where at least a peripheral circuit such as a gate driver circuit forming region GDM is monolithically formed in the non-display region of the display panel when viewed from the normal direction of the substrate 1, and has a function of blocking light so that the backlight light is not incident on the peripheral circuit forming region CR of the display panel 81.

In the present embodiment, as illustrated in the drawing, the panel support portion 85C may be provided with an opening region 87. That is, the panel support portion 85C includes a light shielding region that blocks the light 30 from the backlight and an opening region 87 that transmits or passes a portion of the light 30 from the backlight. As a result, a portion of the backlight light can be incident on the peripheral circuit forming region CR via the opening region 87.

The opening region 87 is disposed so as to overlap at least a portion of the peripheral circuit forming region CR when viewed from the normal direction of the substrate 1. For example, the peripheral edge portion of the display panel supported by the panel support portion 85C includes a first circuit region (gate driver circuit forming region GDM in this example) where is at least a portion of the peripheral circuit forming region, and the opening region 87 may overlap at least a portion of the first circuit region when viewed from the normal direction of the substrate.

The opening region 87 may be a region that passes or transmits light from the backlight 83. The opening region 87 may include one or a plurality of slits, through holes, or cutout portions. The opening region 87 may be provided with a light transmitting portion having a higher light transmittance than other portions (light shielding portion) of the panel support portion 85C.

A portion or all of the opening region 87 may be disposed at a position (for example, around the peripheral circuit forming region CR) that does not overlap the peripheral circuit forming region CR when viewed from the normal direction of the substrate 1. In this case, the opening region 87 may be disposed so that a portion of the light passed or transmitted through the opening region 87 is incident on the peripheral circuit forming region CR due to wraparound or the like.

The amount of backlight light incident on the peripheral circuit forming region CR can be adjusted by the position and size of the opening region 87. The light incident on the peripheral circuit forming region CR can be incident on the oxide semiconductor layer of the second TFT and cause a negative shift of a prescribed threshold voltage in the second TFT.

The display device of the present embodiment may not include the above-described opening region 87. Even in this case, a portion of the backlight light wraps around between the panel support portion 85C and the peripheral circuit forming region CR and is incident on the oxide semiconductor layer of the second TFT, so that the effect of suppressing the positive shift of the threshold voltage can be obtained.

Example of Active Matrix Substrate

The active matrix substrate of the embodiment according to the present disclosure may be provided with at least one first TFT and at least one second TFT or third TFT. Table 1 illustrates the relationship between each TFT provided on the active matrix substrate and the light shielding structure (presence or absence of a light shielding layer).

TABLE 1

| | Pixel TFT | Gate driver circuit TFT (for example, output transistor) | SSD circuit TFT |
|---|---|---|---|
| Positive shift of threshold voltage | Small | Large | Large |
| Example 1 | First light shielding structure (presence of light shielding layer) (AR: 100%) | First light shielding structure (presence of light shielding layer) (AR: 100%) | Second light shielding structure (absence of light shielding layer) (AR: 0%) |
| Example 2 | | Second light shielding structure (absence of light shielding layer) (AR: 0%) | First light shielding structure (presence of light shielding layer) (AR: 100%) |
| Example 3 | | Second light shielding structure (absence of light shielding layer) (AR: 0%) | Second light shielding structure (absence of light shielding layer) (AR: 0%) |
| Example 4 | | Third light shielding structure (partially light shielding layer) (AR: for example, 50%) | Second light shielding structure (absence of light shielding layer) (AR: 0%) |
| Example 5 | | Second light shielding structure (absence of light shielding layer) (AR: 0%) | Third light shielding structure (partially light shielding layer) (AR: for example, 50%) |
| Example 6 | | Third light shielding structure (partially light shielding layer) (AR1: for example, 70%) | Third light shielding structure (partially light shielding layer) (AR2: for example, 30%, AR2 < AR1) |
| Comparative Example | First light shielding structure (presence of light shielding layer) (AR: 100%) | First light shielding structure (presence of light shielding layer) (AR: 100%) | First light shielding structure (presence of light shielding layer) (AR: 100%) |

In the active matrix substrate of Examples 1 to 6, the light shielding layer of the circuit TFT, which is likely to generate a positive shift of the threshold voltage, is removed (second light shielding structure), or the light shielding ratio AR by the light shielding layer is reduced (third light shielding structure). As a result, the characteristics shift of the circuit TFT can be suppressed as compared with the active matrix substrate of the comparative example.

In Examples 4 to 6, the light shielding ratio AR is different between the gate driver circuit TFT and the SSD circuit TFT. As a result, the amount of light incident on the oxide semiconductor layer can be adjusted according to the amount of shift of the threshold voltage that can occur in the circuit TFT in the positive direction. The light shielding ratio AR of the SSD circuit TFT may be smaller than the light shielding ratio AR of the gate driver circuit TFT (Examples 1, 4, and 6).

Of the circuit TFTs, the light shielding ratio AR in the TFT at the position where the backlight light is likely to be incident may be smaller than the light shielding ratio AR in the TFT at the position where the backlight light is unlikely to be incident. For example, as illustrated in FIG. 12B, in a case where the opening region 87 of the frame 85 is provided, the light shielding ratio AR of the TFT close to the opening region 87 may be smaller than the light shielding ratio AR of the TFT located away from the opening region 87.

Method for Manufacturing Active Matrix Substrate 1001

Next, an example of a method for manufacturing the active matrix substrate of the present embodiment will be described with reference to the drawings. Here, a method of manufacturing the first TFT 100, which is a pixel TFT, and the second TFT 200, which is a circuit TFT, will be mostly described. The third TFTs 300, 300*a*, and 300*b* can be manufactured by the same method as that of the second TFT except that the shape of the light shielding layer is different.

FIG. 13 is a table illustrating a process flow for describing an example of a method for manufacturing the active matrix substrate 1001.

STEP 1: Formation of Lower Metal Layer

A lower conductive film (thickness: for example, 50 nm or more and 500 nm or less) is formed on the substrate 1 by, for example, a sputtering method. Next, patterning (for example, wet etching) of the lower conductive film is performed by a known photolithography step. In this manner, the lower metal layer including the light shielding layer 203 in the second TFT is formed.

As the substrate 1, a transparent and insulating substrate, for example, a glass substrate, a silicon substrate, a plastic substrate (resin substrate) having heat resistance, or the like can be used.

The material of the lower conductive film is not particularly limited, and a film containing a metal such as aluminum (Al), tungsten (W), molybdenum (Mo), tantalum (Ta), chromium (Cr), titanium (Ti), or and copper (Cu), an alloy thereof, or a metal nitride thereof can be appropriately used. A laminated film in which a plurality of these films are laminated may be used. Here, as the lower conductive film, a laminated film (Cu/Ti film) containing a Ti film (thickness: 30 nm) and a Cu film (thickness: 200 nm) in this order is used from the substrate 1 side.

STEP 2: Formation of Lower Insulating Layer 5

Next, a lower insulating layer 5 (thickness: 200 nm or more and 600 nm or less) is formed so as to cover the lower metal layer.

The lower insulating layer 5 is formed by, for example, a CVD method. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like can be appropriately used. The lower insulating layer 5 may be a single layer or may have a laminated structure. For example, a silicon nitride (SiNx) layer, a silicon nitride oxide layer, or the like may be formed on the substrate side (lower layer) to restrain diffusion of impurities and the like from the substrate 1, and a silicon oxide (SiO$_2$) layer, a silicon oxynitride layer, or the like may be formed on a layer thereover (upper layer) to secure insulation. Here, as the lower insulating layer 5, a laminated film having a silicon nitride (SiNx) layer (thickness: 50 to 600 nm) as a lower layer and a silicon oxide (SiO$_2$) layer (thickness: 50 to 600 nm) as an upper layer may be formed. In a case where an oxide film such as a silicon oxide film is used as the lower insulating layer 5 (in a case where the lower insulating layer 5 has a laminated structure, as an uppermost layer), since oxidation deficiency generated in a channel region of an oxide semiconductor layer formed later can be reduced by the oxide film, reduction in resistance of the channel region can be suppressed.

STEP 3: Formation of Oxide Semiconductor Layers 107 and 207

Subsequently, an oxide semiconductor film is formed on the lower insulating layer 5. Thereafter, annealing treatment of the oxide semiconductor film may be performed. The thickness of the oxide semiconductor film may be, for example, 15 nm or more and 200 nm or less.

Subsequently, the oxide semiconductor film is patterned by a known photolithography step. The patterning of the oxide semiconductor film may be performed by wet etching using a PAN-based etching solution containing phosphoric acid, nitric acid, and acetic acid, or an oxalic acid-based etching solution, for example. As a result, the oxide semiconductor layers 107 and 207, which are the active layers of the first TFT and the second TFT, are obtained.

The oxide semiconductor film can be formed by, for example, a sputtering method. Here, an In—Ga—Zn—O-based semiconductor film (thickness: 50 nm) containing In, Ga, and Zn is formed as the oxide semiconductor film.

STEP 4: Formation of Gate Insulating Layer and Gate Metal Layer

Next, a gate insulating film (thickness: for example, 80 nm or more and 250 nm or less) and a gate conductive film (thickness: for example, 50 nm or more and 500 nm or less) so as to cover the oxide semiconductor layers 107 and 207.

As the gate insulating film, an insulating film similar to the lower insulating layer 5 (insulating film exemplified as the lower insulating layer 5) can be used. Here, a silicon oxide (SiO$_2$) layer is formed as the gate insulating film. When an oxide film such as a silicon oxide film is used as the insulating film, since oxidation deficiency generated in the channel region of the oxide semiconductor layers 107, 207 can be reduced by the oxide film, reduction in resistance of the channel region can be suppressed.

As the gate conductive film, for example, a metal such as molybdenum (Mo), tungsten (W), aluminum (Al), copper (Cu), titanium (Ti), tantalum (Ta), or an alloy thereof can be used. The gate conductive film may have a laminated structure including a plurality of layers formed of different conductive materials. Here, as the gate conductive film, a Cu and Ti laminated film having a Ti film as a lower layer and a Cu film as an upper layer, or a Cu and Mo laminated film having a Mo film as a lower layer and a Cu film as an upper layer is used.

Thereafter, a resist layer is formed on the gate conductive film, and the gate conductive film is patterned using the resist layer as a mask to form a gate metal layer containing gate electrodes GE1, GE2 and a gate bus line GL. Next, the gate insulating film is etched using the resist layer or the gate metal layer as a mask to obtain the gate insulating layers 109 and 209. As a result, the regions of the oxide semiconductor layers 107 and 207 that overlap the gate electrode GE1 and GE2 via the gate insulating layers 109 and 209 are the channel regions 107c and 207c.

STEP 5: Resistance Lowering Treatment and Formation of Interlayer Insulating Layer 10

Subsequently, the oxide semiconductor layers 107 and 207 may be subjected to a resistance lowering treatment. For example, as the resistance lowering treatment, a plasma treatment may be performed. As a result, when viewed from the normal direction of the principal surface of the substrate 1, the exposed regions (first region and second region) located on both sides of the channel regions 107c and 207c of the oxide semiconductor layers 107 and 207 are low resistance regions having a lower specific resistance than that of the channel regions 107c and 207c. The low resistance region may be a conductor region (for example, sheet resistance: 200 Ω/or less).

Next, an interlayer insulating layer 10 covering the oxide semiconductor layers 107 and 207, the gate insulating layers 109 and 209, and the gate metal layers is formed. As the interlayer insulating layer 10, an inorganic insulating layer such as a silicon oxide film, a silicon nitride film, a silicon oxynitride film, a silicon nitride oxide film, or the like can be formed as a single layer or a laminated layer. The thickness of the inorganic insulating layer may be 100 nm or more and 500 nm or less. When the interlayer insulating layer 10 is formed using an insulating film such as a silicon nitride film that reduces an oxide semiconductor, this is preferable because the specific resistance of a region (here, a low resistance region) in contact with the interlayer insulating layer 10 in the oxide semiconductor layers 107, 207 can be maintained low. Here, as the interlayer insulating layer 10, a laminated film having a SiO$_2$ layer as a lower layer and a SiNx layer as an upper layer is formed by, for example, a CVD method.

Thereafter, the interlayer insulating layer 10 is patterned by, for example, dry etching. As a result, the source opening portions 110s and 210s that expose a portion of the first region (source contact region) of the oxide semiconductor layers 107 and 207, and the drain opening portions 110d and 210d that exposes a portion of the second region (drain contact region) are formed in the interlayer insulating layer 10.

STEP 6: Formation of Source Metal Layer

Next, a source conductive film (thickness: for example, 50 nm or more and 500 nm or less) is formed on the interlayer insulating layer 10, and the source conductive film is patterned. As a result, the upper metal layer including the source electrodes SE1 and SE2, the drain electrodes DE1 and D2, and the source bus line SL is formed. Each of the source electrodes SE1 and SE2 are connected to the first region of the oxide semiconductor layers 107 and 207 in the source opening portions 110s and 210s. The drain electrodes DE1 and DE2 are connected to the second region of the oxide semiconductor layers 107 and 207 in the drain opening portions 110d and 210d. In this manner, the first TFT 100 and the second TFT 200 are manufactured.

As the source conductive film, for example, an element selected from aluminum (Al), chromium (Cr), copper (Cu), tantalum (Ta), titanium (Ti), molybdenum (Mo), or tungsten (W), or an alloy containing these elements as components can be used. For example, the source conductive film may have a three-layer structure of a titanium film-aluminum film-titanium film, a three-layer structure of a molybdenum film-aluminum film-molybdenum film, or the like. Here, a laminated film in which a Ti film (thickness: 15 to 70 nm) is a lower layer and a Cu film (thickness: 200 to 400 nm) is an upper layer is used.

STEP 7: Formation of Inorganic Insulating Layer 11 and Organic Insulating Layer 12

Next, the upper insulating layer 13 is formed so as to cover the interlayer insulating layer 10 and the source metal layer. Here, as the upper insulating layer 13, an inorganic insulating layer 11 (thickness: for example, 100 nm or more and 500 nm or less) and an organic insulating layer 12 (thickness: for example, 1 to 3 μm, preferably 2 to 3 μm) are formed in this order. The entire portion of the organic insulating layer 12 located in the non-display region may be removed. Alternatively, the organic insulating layer 12 may not be formed.

As the inorganic insulating layer 11, an inorganic insulating film similar to the interlayer insulating layer 10 (insulating film exemplified as the interlayer insulating layer 10) can be used. Here, as the inorganic insulating layer 11, for example, a SiNx layer (thickness: 300 nm) is formed by a CVD method. The organic insulating layer 12 may be, for example, an organic insulating film (for example, acrylic resin film) containing a photosensitive resin material.

Thereafter, the organic insulating layer 12 is patterned. As a result, in each pixel region PIX, an opening portion 12p exposing a portion of the inorganic insulating layer 11 is formed in the organic insulating layer 12. The opening portion 12p is disposed so as to overlap the drain electrode DE1 of the pixel TFT when viewed from the normal direction of the substrate 1.

STEP 8: Formation of Common Electrode CE

Subsequently, a common electrode CE is formed on the upper insulating layer 13.

First, a first transparent conductive film (thickness: 20 to 300 nm) (not illustrated) is formed on the upper insulating layer 13 and in the opening portion 12p. Here, for example, an indium-zinc oxide film is formed as the first transparent conductive film by a sputtering method. As the material of the first transparent electrode film, metal oxides such as indium-tin oxide (ITO), indium-zinc oxide, and ZnO can be used. Thereafter, the first transparent conductive film is patterned. In patterning, for example, wet etching may be performed using an oxalic acid-based etching solution. As a result, a common electrode CE is obtained. The common electrode CE may be disposed over substantially the entire display region, except for the pixel contact hole forming region where the pixel contact hole CHp is formed, for example.

STEP 9: Formation of Dielectric Layer 17

Next, a dielectric layer (thickness: 50 to 500 nm) 17 is formed so as to cover the common electrode CE, and the dielectric layer 17 and the inorganic insulating layer 11 are patterned.

The dielectric layer 17 is formed on the organic insulating layer 12 and the common electrode CE and in the opening portion 12p in the pixel region PIX. The material of the dielectric layer 17 may be the same as the material exemplified as the material of the inorganic insulating layer 11. Here, a SiN film is formed as the dielectric layer 17 by, for example, a CVD method.

Thereafter, a resist layer (not illustrated) formed on the dielectric layer 17 is formed by a photolithography step. Using the resist layer and the organic insulating layer 12 as masks, the dielectric layer 17 and the inorganic insulating layer 11 are etched (for example, dry etching). The etching of the dielectric layer 17 and the inorganic insulating layer 11 may be performed in the same etching step. As a result, a pixel contact hole CHp that exposes a portion of the second region 7d of the oxide semiconductor layer 7 is formed in the pixel region PIX. The pixel contact hole CHp includes the opening portion 11p formed in the inorganic insulating layer 11, the opening portion 12p of the organic insulating layer 12, and the opening portion 17p of the dielectric layer 17.

The opening portion 17p may be at least partially overlapped the opening portion 12p when viewed from the normal direction of the substrate 1.

STEP 10: Formation of Pixel Electrode PE

Subsequently, a second transparent conductive film (not illustrated) (thickness: 20 to 300 nm) is formed on the dielectric layer 17 and in the pixel contact hole CHp. The material of the second transparent conductive film may be the same as the material exemplified as the material of the second transparent conductive film (for example, ITO).

Thereafter, the second transparent conductive film is patterned. For example, the second transparent conductive film may be wet-etched using an oxalic acid-based etching solution. As a result, the pixel electrode PE is obtained. The pixel electrode PE is formed on the dielectric layer 17 and in the pixel contact hole CHp in the pixel region PIX, and is connected to the drain electrode DE of the pixel TFT in the pixel contact hole CHp. As described above, the active matrix substrate 1001 is manufactured.

About Oxide Semiconductor

The oxide semiconductor included in the oxide semiconductor layer of each TFT according to the present embodiment may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c-axis is substantially perpendicular to a layer surface.

The oxide semiconductor layer may have a laminated structure of two or more layers. In a case where the oxide semiconductor layer has a laminated structure, the oxide semiconductor layer may include an amorphous oxide semiconductor layer and a crystalline oxide semiconductor layer. Alternatively, a plurality of crystalline oxide semiconductor layers having different crystal structures may be included. A plurality of amorphous oxide semiconductor layers may be included. In a case where the oxide semiconductor layer has a two-layer structure including an upper layer and a lower layer, the energy gap of the oxide semiconductor included in a layer located on the gate electrode side (lower layer for bottom gate structure, and upper layer for top gate structure) of the two layers may be smaller than the energy gap of the oxide semiconductor included in a layer located on a side opposite to the gate electrode (upper layer for bottom gate structure, and lower layer for top gate structure). Hear, in a case where the difference in energy gap between these layers is relatively small, the energy gap of the oxide semiconductor in the layer located on the gate electrode side may be larger than the energy gap of the oxide semiconductor in the layer located on the side opposite to the gate electrode.

Materials, structures, film formation methods, configurations of oxide semiconductor layers having a laminated structure, and the like of the amorphous oxide semiconductor and each of the above crystalline oxide semiconductors are described in, for example, Japanese Unexamined Patent Application Publication No. 2014-007399. For reference, the entire contents disclosed in Japanese Unexamined Patent Application Publication No. 2014-007399 are incorporated herein.

The oxide semiconductor layer may include, for example, at least one metal element among In, Ga, and Zn. In the present embodiment, the oxide semiconductor layer includes, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), a ratio (composition ratio) of In, Ga, and Zn is not particularly limited, and includes, for example, In:Ga:Zn=2:2:1, In:Ga:Zn=1: 1:1, In:Ga:Zn=1:1:2, and the like. Such an oxide semiconductor layer can be formed of an oxide semiconductor film including an In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c-axis is oriented substantially perpendicular to the layer surface is desirable.

The crystal structure of a crystalline In—Ga—Zn—O-based semiconductor is disclosed in, for example, above Japanese Unexamined Patent Application Publication No. 2014-007399, Japanese Unexamined Patent Application Publication No. 2012-134475, and Japanese Unexamined Patent Application Publication No. 2014-209727. For reference, the entire contents disclosed in Japanese Unexamined Patent Application Publication No. 2012-134475 and Japanese Unexamined Patent Application Publication No. 2014-209727 are incorporated herein. A TFT having an In—Ga—Zn—O-based semiconductor layer has high mobility (more than 20 times that of an a-Si TFT) and low leak current (less than 1/100 that of an a-Si TFT). Therefore, the TFT is suitably used as a driving TFT (for example, TFT included in a drive circuit provided on the same substrate as that of a display region around a display region including a plurality of pixels) and a pixel TFT (TFT provided in a pixel).

The oxide semiconductor layer may include another oxide semiconductor instead of the In—Ga—Zn—O-based semiconductor. For example, an In—Sn—Zn—O-based semiconductor (for example, In2O3-SnO2-ZnO; InSnZnO) may be included. The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a cadmium oxide (CdO), Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, In—W—Zn—O-based semiconductor, and the like.

The present disclosure contains subject matter related to that disclosed in U.S. Provisional Patent Application No. 63/012,991 filed in the U.S. Patent Office on Apr. 21, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate that includes a display region including pixel regions and a non-display region including a peripheral circuit defining region located around the display region and in which a peripheral circuit is provided, the active matrix substrate comprising:
   a substrate;
   a bottom conductive film supported on the substrate;
   a lower insulating layer covering the bottom conductive film;
   an oxide semiconductor layer located above the lower insulating layer, and including a channel region and first and second regions located on two sides of the channel region;
   a gate insulating film covering the channel region of the oxide semiconductor layer;
   a first conductive film located above the gate insulating film;
   an interlayer insulating layer covering the first conductive film;
   a second conductive film located above the interlayer insulating layer; and
   oxide semiconductor TFTs including a pixel TFT located in the display region and a circuit TFT located in the non-display region; wherein the pixel TFT includes:
   a first oxide semiconductor layer made from the oxide semiconductor layer;
   a first gate insulating film made from the gate insulating film;
   a first gate electrode made from the first conductive film, and overlapping the channel region of the first oxide semiconductor layer;
   a first bottom metal film made from the bottom conductive film, and overlapping the entire channel region of the first oxide semiconductor layer;
   a first interlayer insulating layer made from the interlayer insulating layer, and including an opening;
   a first electrode connected to the first region of the first oxide semiconductor layer; and
   a second electrode made from the second conductive film, and connected to the second region of the first oxide semiconductor layer via the opening; and
   the circuit TFT includes:
   a second oxide semiconductor layer made from the oxide semiconductor layer;
   a second gate insulating film made from the gate insulating film;
   a second gate electrode made from the first conductive film, and overlapping the channel region of the second oxide semiconductor layer;
   a third electrode connected to the first region of the second oxide semiconductor layer; and
   a fourth electrode connected to the second region of the second oxide semiconductor layer.

2. The active matrix substrate according to claim 1, wherein
   the circuit TFT further includes:
   a second bottom metal film made from the bottom conductive film, and overlapping only a portion of the channel region of the second oxide semiconductor layer.

3. The active matrix substrate according to claim 1, further comprising:
   gate lines and source lines supported on the substrate; wherein
   the source lines are made from the bottom conductive film.

4. The active matrix substrate according to claim 1, wherein the first bottom metal film electrically connected to the first gate electrode.

5. The active matrix substrate according to claim 1, wherein the first bottom metal film is electrically connected to the first electrode.

6. The active matrix substrate according to claim 1, wherein the peripheral circuit includes a gate driver connected to the gate lines.

7. The active matrix substrate according to claim 1, wherein the oxide semiconductor layer includes at least one metal element selected from In, Ga, and Zn.

8. A display device comprising the active matrix substrate according to claim 2.

9. The active matrix substrate according to claim 1, wherein the circuit TFT is of a top gate type.

10. The active matrix substrate according to claim 1, wherein
   the bottom conductive film is not provided between the substrate and the channel region of the second oxide semiconductor layer.

11. The active matrix substrate according to claim 10, wherein the circuit TFT is of a top gate type.

* * * * *